(12) United States Patent
Terada et al.

(10) Patent No.: US 7,310,362 B2
(45) Date of Patent: Dec. 18, 2007

(54) SEMICONDUCTOR LIGHT EMITTING DEVICE AND SEMICONDUCTOR LIGHT EMITTING APPARATUS

(75) Inventors: Toshiyuki Terada, Kanagawa-ken (JP); Takashi Jyonai, Oita-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 302 days.

(21) Appl. No.: 11/046,842

(22) Filed: Feb. 1, 2005

(65) Prior Publication Data
US 2005/0232324 A1 Oct. 20, 2005

(30) Foreign Application Priority Data
Feb. 4, 2004 (JP) ............... 2004-028159

(51) Int. Cl.
*H01S 5/00* (2006.01)
(52) U.S. Cl. .............. 372/46.01; 372/43.01; 372/45.01; 372/50.1
(58) Field of Classification Search .......... 372/36, 372/43.01, 45, 46
See application file for complete search history.

(56) References Cited

U.S. PATENT DOCUMENTS

| 5,289,487 | A | * | 2/1994 | Shimada | ............... 372/46.01 |
|---|---|---|---|---|---|
| 5,305,340 | A | | 4/1994 | Antreasyan et al. | |
| 6,707,071 | B2 | | 3/2004 | Hashimoto et al. | |
| 6,738,398 | B2 | * | 5/2004 | Hirata et al. | ............... 372/32 |
| 6,771,676 | B2 | | 8/2004 | Takeuchi et al. | |
| 2001/0001612 | A1 | * | 5/2001 | Inomoto et al. | ............... 372/50 |
| 2002/0186736 | A1 | * | 12/2002 | Takahashi | ............... 372/50 |
| 2003/0048818 | A1 | * | 3/2003 | Takeuchi et al. | ............... 372/36 |
| 2003/0193976 | A1 | * | 10/2003 | Shiomoto | ............... 372/36 |
| 2006/0209413 | A1 | * | 9/2006 | Kim et al. | ............... 359/577 |

FOREIGN PATENT DOCUMENTS

JP 2002-223039 8/2002

* cited by examiner

*Primary Examiner*—Minsun Oh Harvey
*Assistant Examiner*—Yuanda Zhang
(74) *Attorney, Agent, or Firm*—Oblon, Spivak, McClelland, Maier & Neustadt, P.C.

(57) ABSTRACT

A semiconductor light emitting device comprises: a stacked body of semiconductor including an active layer; a ridge stripe protruding and extending in a first direction on a first major surface of the stacked body; dummy ridges protruding on the first major surface of the stacked body on both sides of the ridge stripe; and a slit formed on the first major surface of the stacked body. The ridge stripe includes at least a portion of a waveguide that guides light emission generated by injected current. The slit extends along a second direction which crosses the first direction, and divides one of the dummy ridges.

20 Claims, 30 Drawing Sheets

US 7,310,362 B2

SEMICONDUCTOR LIGHT EMITTING DEVICE AND SEMICONDUCTOR LIGHT EMITTING APPARATUS

CROSS-REFERENCE TO RELATED APPLICATIONS

This application is based upon and claims the benefit of priority from the prior Japanese Patent Application No. 2004-028159, filed on Feb. 4, 2004; the entire contents of which are incorporated herein by reference.

BACKGROUND OF THE INVENTION

The invention relates to a semiconductor light emitting device and a semiconductor light emitting apparatus, and more particularly, to a semiconductor light emitting device such as a semiconductor laser with a ridge stripe and a semiconductor light emitting apparatus equipped with the same.

In recent years, semiconductor lasers having oscillation wavelengths of 600 to 700 nm have been put to practical use such as in DVD (digital versatile disc). For their further application to writing for DVD-R (recordable) and DVD-RW (rewritable), higher output power is required. One of the device structures of a semiconductor laser that meets such requirements is a "ridge-waveguide type" structure. In a ridge-waveguide type semiconductor laser, lightwave is confined and propagated in a stripe-shaped ridge to control the horizontal transverse mode. Thus it has an advantage that excellent optical output characteristics can be obtained.

In such a high-powered semiconductor laser, the amount of heat generated from its active layer is also increased. For this reason, in order to improve heat dissipation from the laser device, it is desirable to use a so-called "junction down" mounting configuration, in which the p-n junction is mounted in the close vicinity of a submount or other packaging member.

However, in junction down mounting, there is a problem that stress concentrates on the ridge protruding like a stripe, which makes the ridge prone to break. In this respect, a semiconductor laser comprising "dummy ridges" on both sides of the ridge is disclosed (e.g., Japanese Laid-Open Patent Applications 2000-164986 and 2002-223039).

FIG. 30 is a plan view of a semiconductor laser comprising dummy ridges as viewed from its mounting surface.

FIG. 31 is a cross-sectional view along line A-A in FIG. 30.

More specifically, the semiconductor laser 100 shown in these figures has a ridge stripe 112 protruding like a stripe formed on its mounting surface M. Dummy ridges 114 are provided on both sides of the ridge stripe 112. The dummy ridges 114 are continuously formed along the longitudinal direction of the ridge stripe 112.

Current injected via electrodes (not shown) provided on the upper and lower surfaces of the device is narrowed by the ridge stripe 112 and causes light emission at the p-n junction formed on its bottom. The emitted light propagates in the ridge stripe 112 to cause laser oscillation, which is emitted as laser light L from the end face.

When such a laser device is mounted in the junction down configuration, the mounting stress may concentrate on the ridge stripe to cause its breakdown. In this respect, dummy ridges 114 with the same height as the ridge stripe 112 can be provided on both sides of the ridge stripe 112. This can prevent the breakdown of the ridge stripe 112 by dispersing the stress when the mounting surface M is mounted on the packaging member (not shown).

SUMMARY OF THE INVENTION

According to an aspect of the invention, there is provided a semiconductor light emitting device comprising: a stacked body of semiconductor including an active layer; a ridge stripe protruding and extending in a first direction on a first major surface of the stacked body, the ridge stripe including at least a portion of a waveguide that guides light emission generated by injected current; dummy ridges protruding on the first major surface of the stacked body on both sides of the ridge stripe; and a slit formed on the first major surface of the stacked body, the slit extending along a second direction which crosses the first direction, and the slit dividing one of the dummy ridges.

According to other aspect of the invention, there is provided a semiconductor light emitting apparatus comprising: a packaging member; and a semiconductor light emitting device having: a stacked body of semiconductor including an active layer; a ridge stripe protruding and extending in a first direction on a first major surface of the stacked body, the ridge stripe including at least a portion of a waveguide that guides light emission generated by injected current; dummy ridges protruding on the first major surface of the stacked body on both sides of the ridge stripe; and a slit formed on the first major surface of the stacked body, the slit extending along a second direction which crosses the first direction, and the slit dividing one of the dummy ridges, the semiconductor light emitting device being bonded to the packaging member so that the packaging member faces the first major surface.

DETAILED DESCRIPTION

Figure 30:
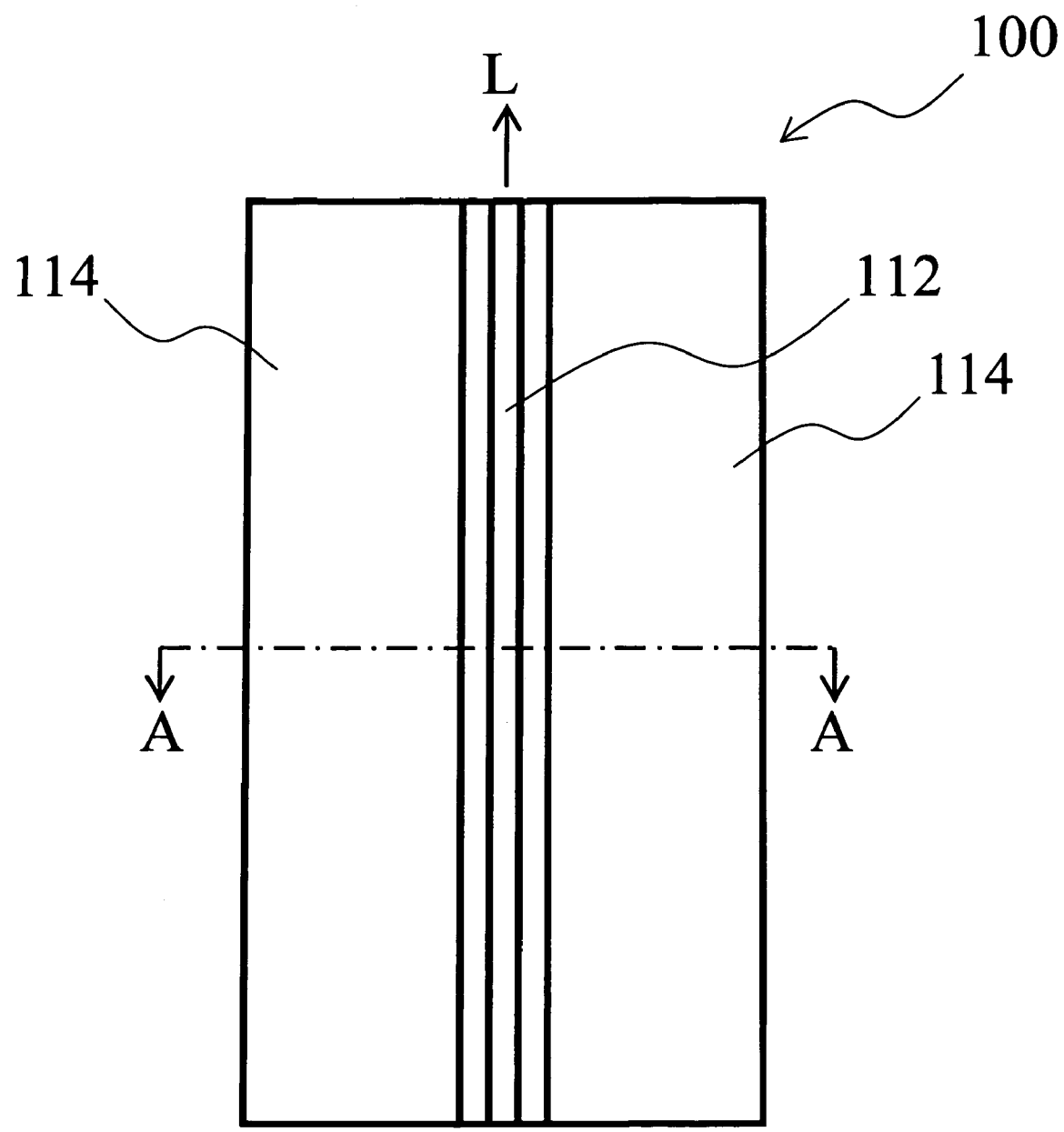
FIG. 30 is a plan view of a semiconductor laser comprising dummy ridges as viewed from its mounting surface.
Figure 31:
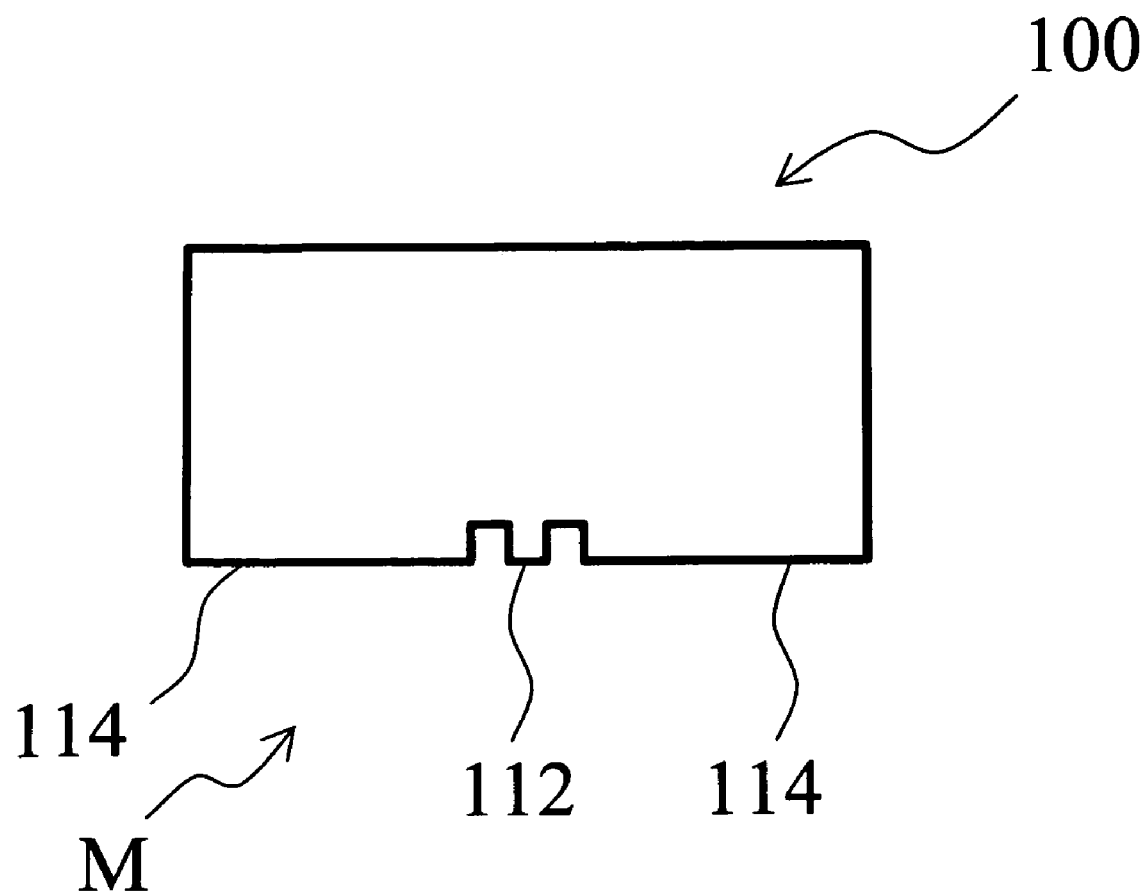
FIG. 31 is a cross-sectional view along line A-A in FIG. 30.

The inventor's independent trial production and investigation has revealed that the semiconductor laser as shown in FIGS. 30 and 31 mounted on the packaging member in the junction down configuration may have void formed in the solder layer underlying the ridge stripe 112, which may degrade temperature or other characteristics.

Figure 32:
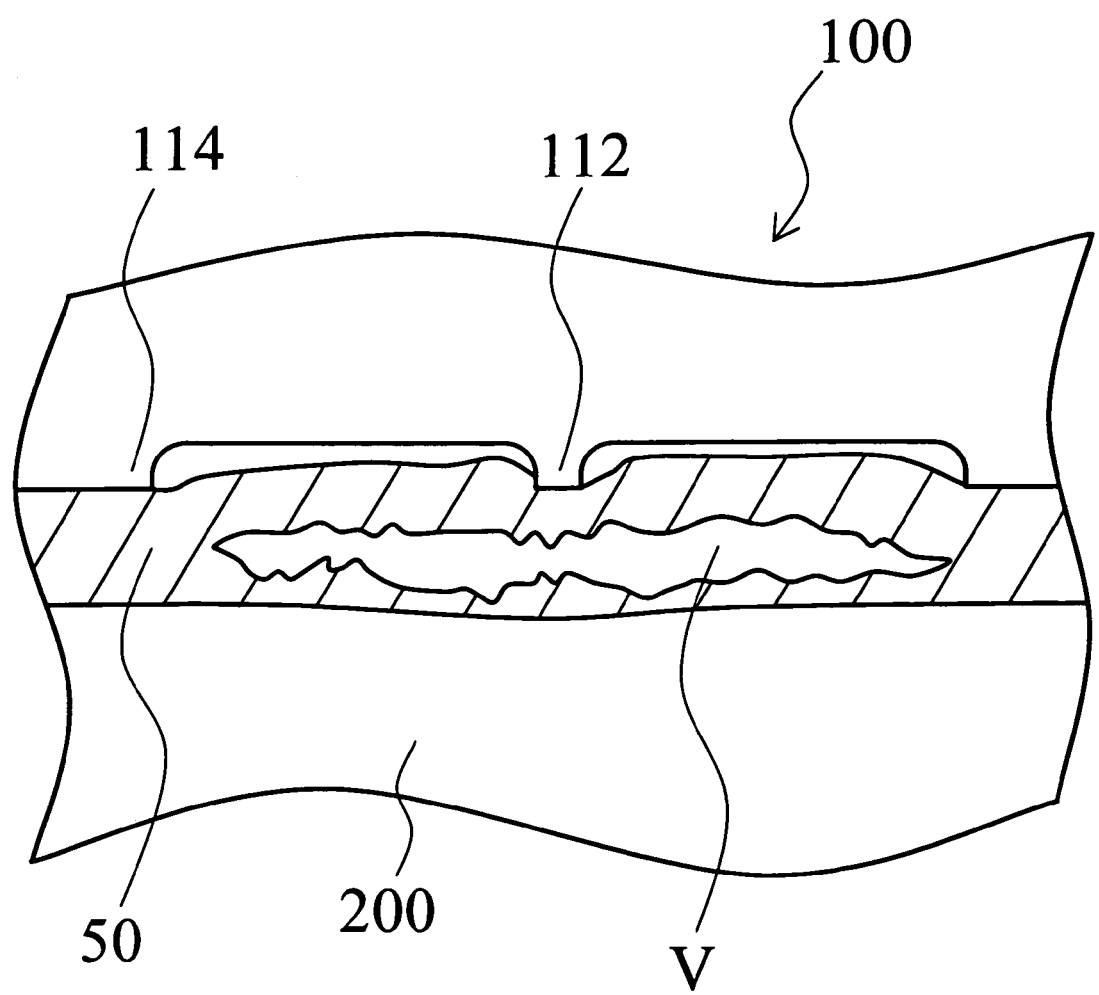
FIG. 32 is a partial enlarged view showing a cross section after the semiconductor laser shown in FIGS. 30 and 31 is mounted in the junction down configuration.

FIG. 32 is a partial enlarged view showing a cross section after the semiconductor laser shown in FIGS. 30 and 31 is mounted in the junction down configuration.

When the semiconductor laser 100 was mounted on a submount 200 with gold-tin (Au—Sn) 50, void V was formed in the solder layer of gold-tin 50 below the ridge stripe 112. It was observed that the void V extended from directly below the ridge stripe 112 to the dummy ridges 114 formed on its both sides. Formation of such void V significantly decreases the thermal contact between the semiconductor laser 100 and the submount 200. As a result, heat generated at the p-n junction underlying the ridge stripe 112 may not be dissipated, thereby significantly degrading the thermal characteristics of the semiconductor laser 100. That is, it may cause decrease of output, maximum operating temperature, and long-term reliability.

Embodiments of the invention will now be described with reference to the drawings.

Figure 1:
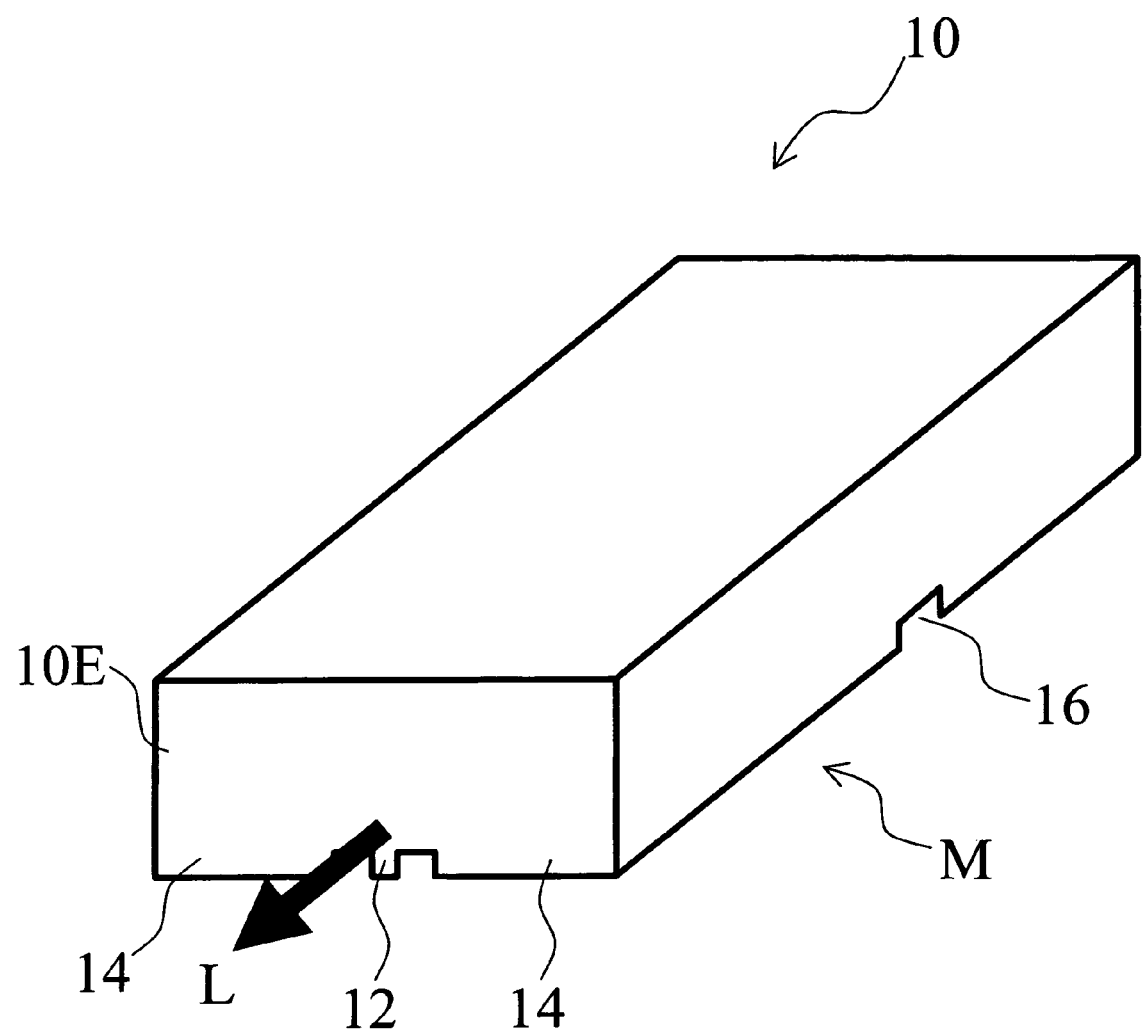
FIG. 1 is a perspective view showing a semiconductor light emitting device according to a first embodiment of the invention.

FIG. 1 is a perspective view showing a semiconductor light emitting device according to a first embodiment of the invention.

Figure 2:
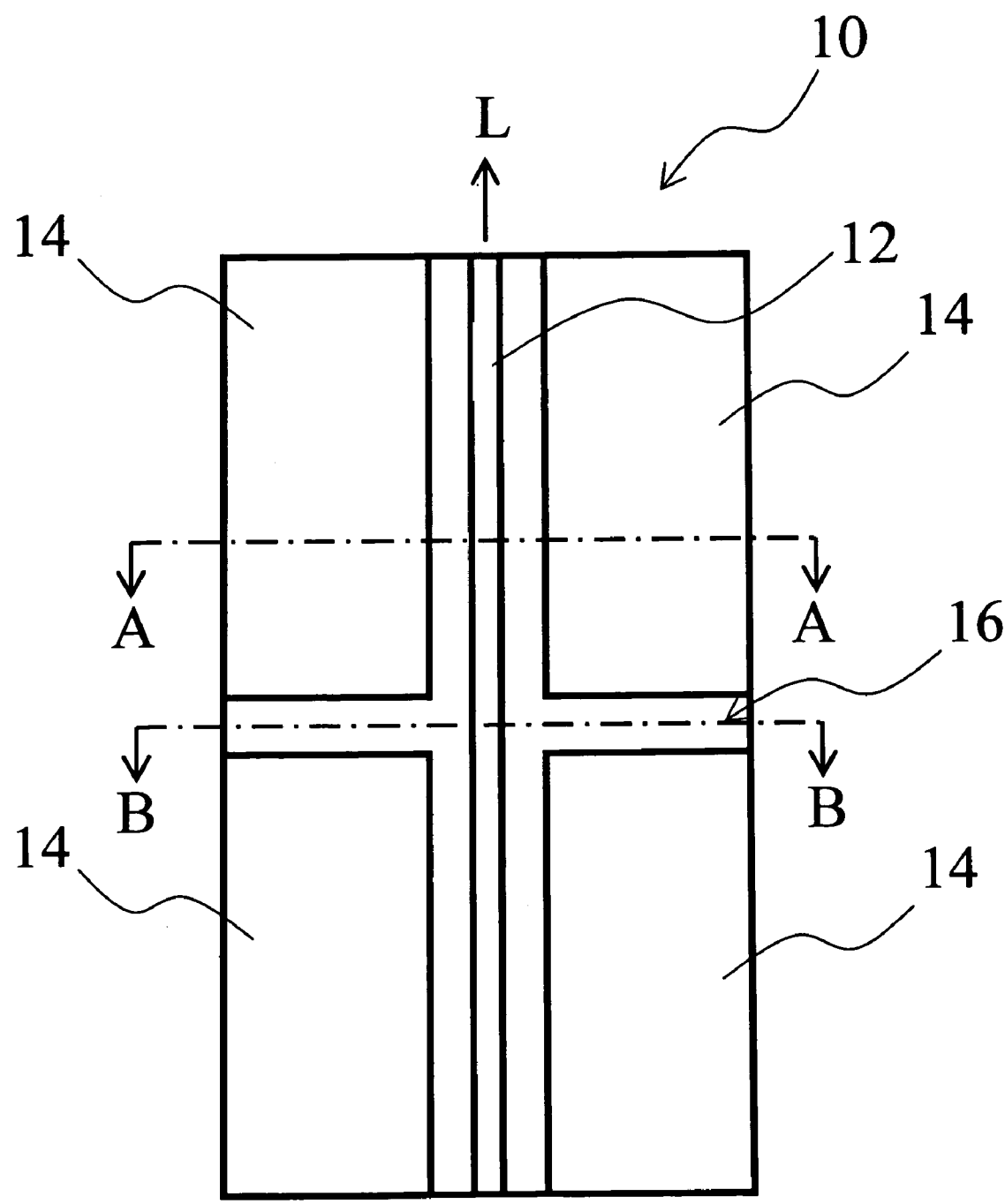
FIG. 2 is a plan view of a semiconductor light emitting device of the first embodiment of the invention as viewed from its mounting surface M.

FIG. 2 is a plan view of a semiconductor light emitting device of the first embodiment as viewed from its mounting surface M.

Figure 3:
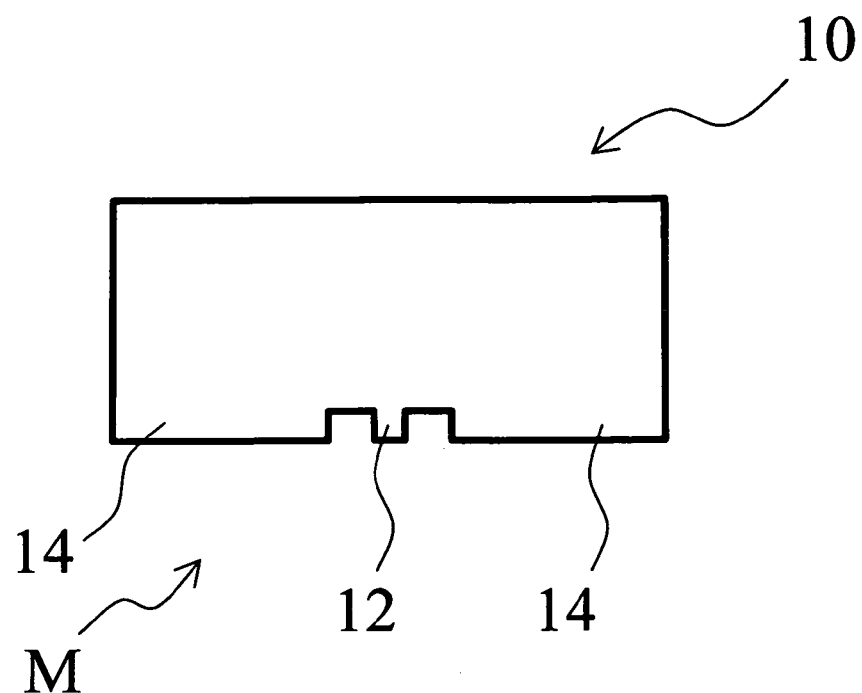
FIG. 3 is a cross-sectional view along line A-A in FIG. 2.
Figure 4:
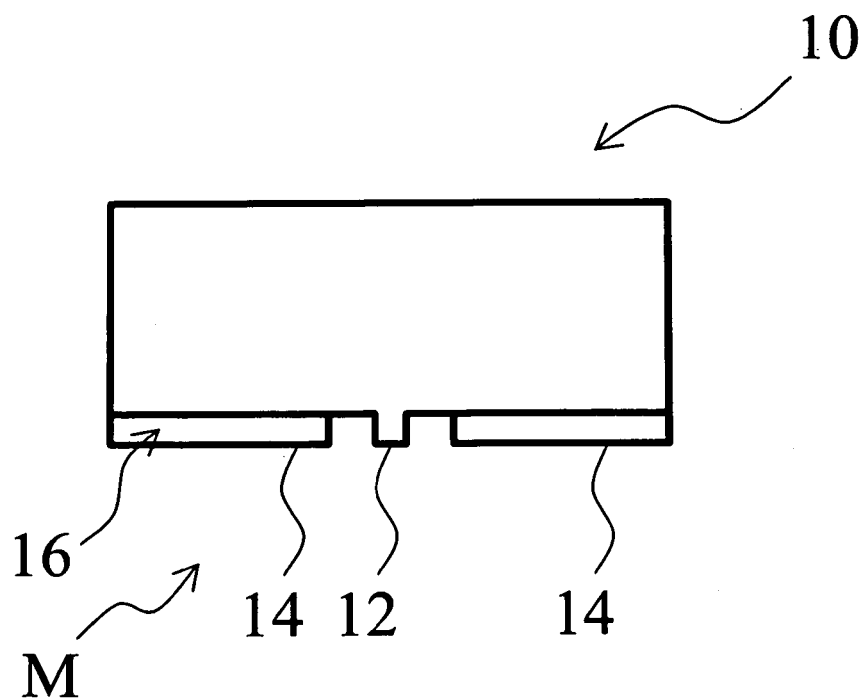
FIG. 4 is a cross-sectional view along line B-B in FIG. 2.

FIG. 3 is a cross-sectional view along line A-A in FIG. 2, and FIG. 4 is a cross-sectional view along line B-B in FIG. 2.

More specifically, the semiconductor light emitting device 10 shown in these figures is a ridge-waveguide type semiconductor laser. The laser device 10 is mounted on a packaging member (not shown) in the junction down configuration. Laser light L is emitted from an end face 10E near the ridge stripe 12. The ridge stripe 12 protruding like a stripe is formed on the mounting surface M. Dummy ridges 114 are provided on both sides of the ridge stripe 112 with certain spacing. It should be noted that in this embodiment, the dummy ridges are not continuously formed along the longitudinal direction of the ridge stripe 12, but are separated as appropriate by a slit 16.

Figure 5:
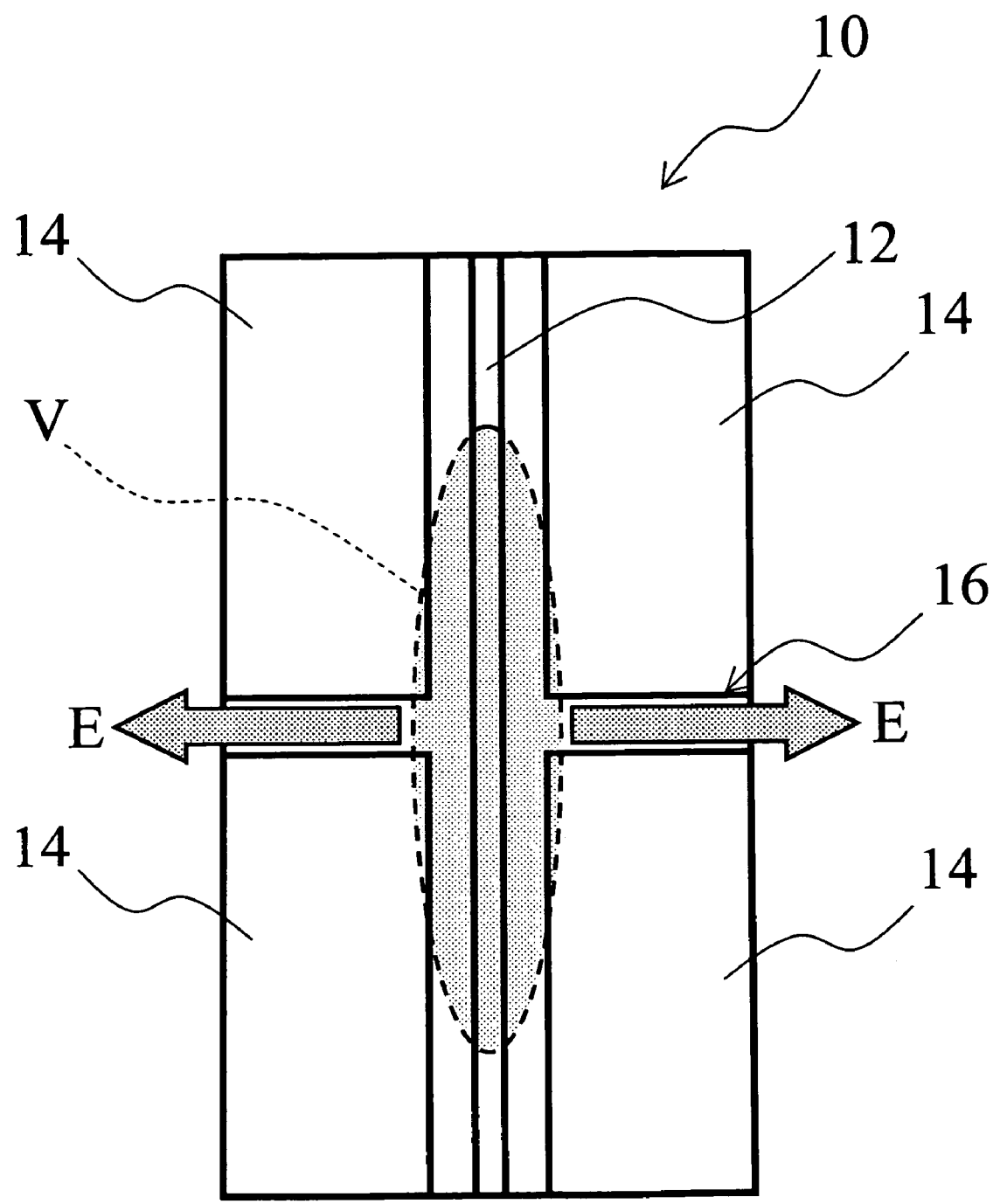
FIG. 5 is a conceptual view for illustrating the function of the slit 16.

FIG. 5 is a conceptual view for illustrating the function of the slit 16. More specifically, when the laser device 10 is mounted on a submount or other packaging member (not shown) with solder (or adhesive) such as gold-tin, void V may occur in the solder layer as described above with reference to FIG. 32. This is because the dummy ridges 14 provided on both sides of the ridge stripe 12 prevent air bubbles from escaping out of the solder layer. On the contrary, according to this embodiment, the slit 16 provided to the dummy ridges 14 can provide an "escape route" for void V. That is, even if void V as shown occurs from air involved in the solder layer below the ridge stripe 12 at the time of mounting, the air can be ejected via the slit 16 as indicated by arrow E by applying weight on the laser device 10 against the packaging member.

Figure 6:
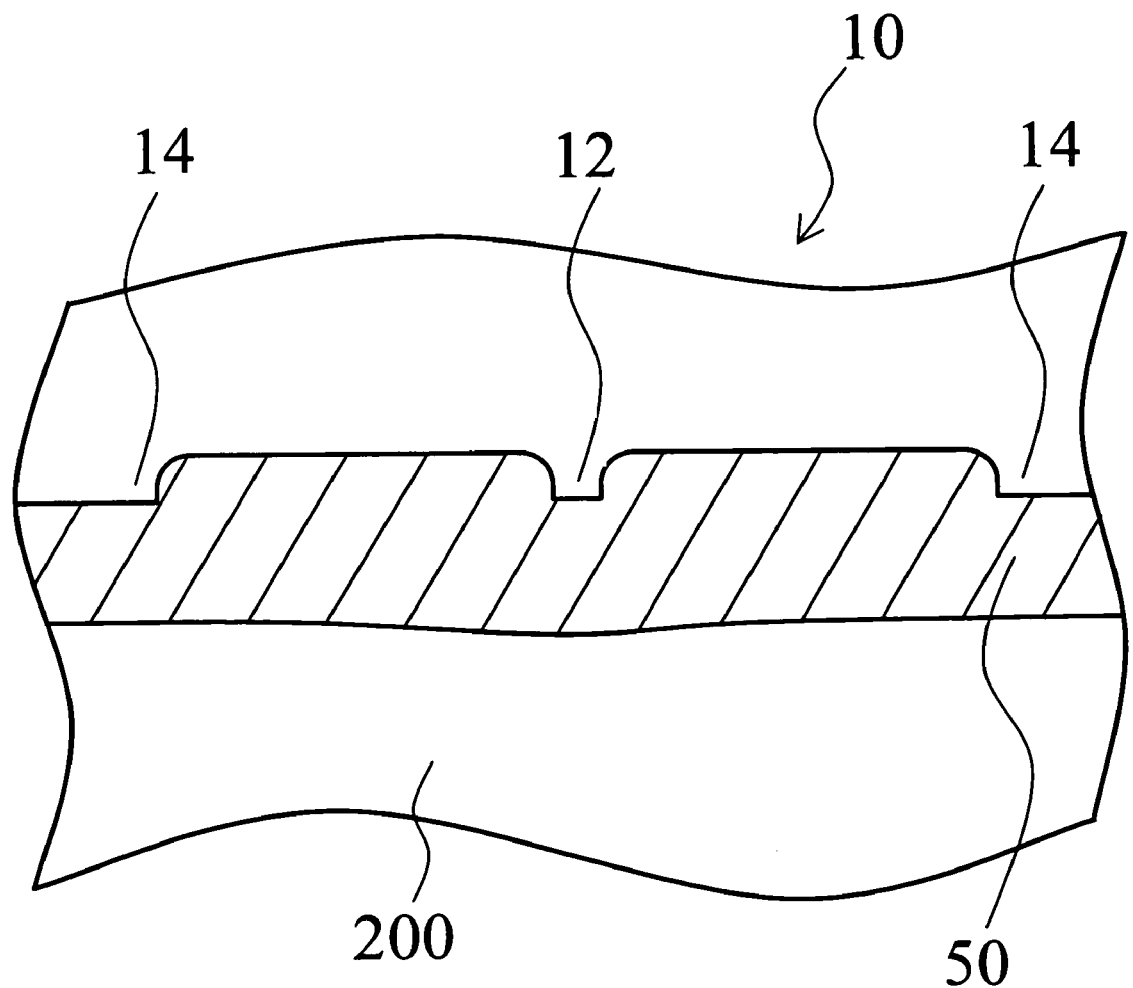
FIG. 6 is a partial enlarged cross-sectional view showing a semiconductor laser device of the first embodiment of the invention in a mounted state.

FIG. 6 is a partial enlarged cross-sectional view showing a semiconductor laser device of the first embodiment in a mounted state.

More specifically, the laser device 10 is mounted on the submount 200 with the gold-tin solder layer 50 in the junction down configuration. According to this embodiment, no void is formed in the solder layer 50 as shown in the figure. The bottom of the ridge stripe 12 is bonded to the submount 200 with the continuous solder layer 50. As a result, the physical bonding strength of the semiconductor laser device 10 can be improved, and at the same time, thermal contact can be significantly improved. That is, heat generated in the light emitting portion of the laser device 10 is efficiently dissipated to the submount 200, which can improve not only the initial characteristics but also the long-term reliability of the laser.

The invention can also be applied to a semiconductor light emitting device in which bonding solder layer 50 made of gold-tin or the like is formed in advance.

Figure 7:
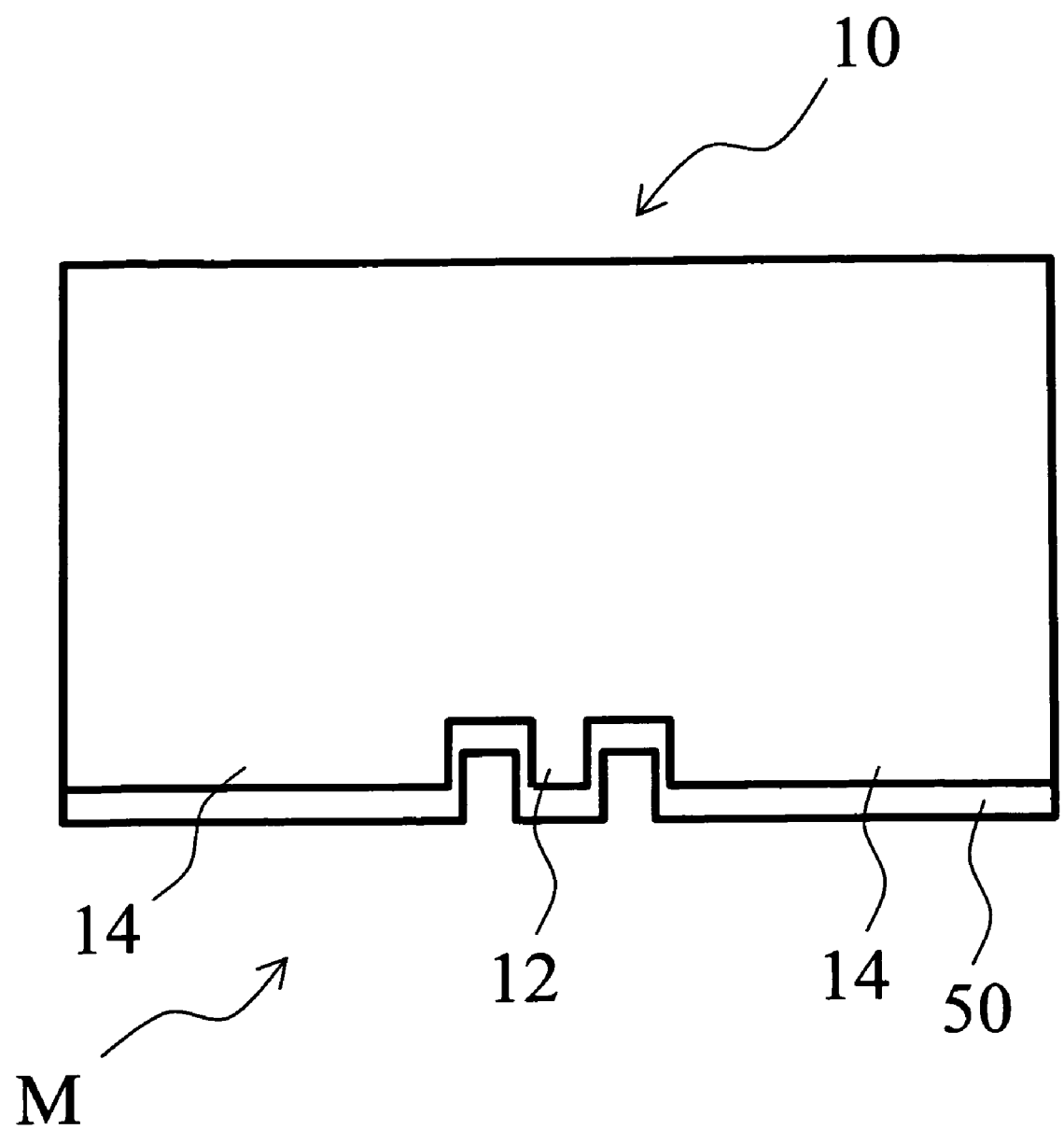
FIG. 7 is a schematic cross-sectional view showing the semiconductor light emitting device on which a solder layer is formed.

FIG. 7 is a schematic cross-sectional view showing the semiconductor light emitting device on which a solder layer is formed. That is, this figure corresponds to the line A-A cross section in FIG. 2. With respect to FIG. 7, elements similar to those described with reference to FIGS. 1 to 6 are marked with the same numerals and are not described in detail.

In the light emitting device of this specific example, a solder layer 50 is formed on the mounting surface M of the device. The solder layer 50 can be formed, for example, by depositing solder material such as gold-tin by vapor deposition or other methods, as described in detail later as an example of the invention.

In one method of mounting a light emitting device with solder, a solder chip in the form of preform or the like is placed on the packaging member, and the light emitting device is placed thereon. By applying weight to the device with heating, the solder chip is melted, and thereby the device is bonded. In this case, however, solder preform is required, and its handling is cumbersome.

In this respect, as illustrated in FIG. 7, the mounting process can be significantly simplified by forming a solder layer 50 on the mounting surface of the light emitting device in advance. However, when a solder layer 50 is formed with uniform thickness, air tends to remain near the center of the light emitting device, that is, in the portion below the ridge stripe 12, which may cause formation of void V.

On the contrary, according to this embodiment, an escape route of air is provided and generation of void V can be prevented by providing a slit 16 as illustrated in FIG. 5. As a result, the light emitting device 10 can be firmly bonded to achieve good thermal contact.

On the other hand, it is particularly advantageous to apply the invention to a light emitting device having a ridge stripe 12 formed lower than dummy ridges 14.

Figure 8:
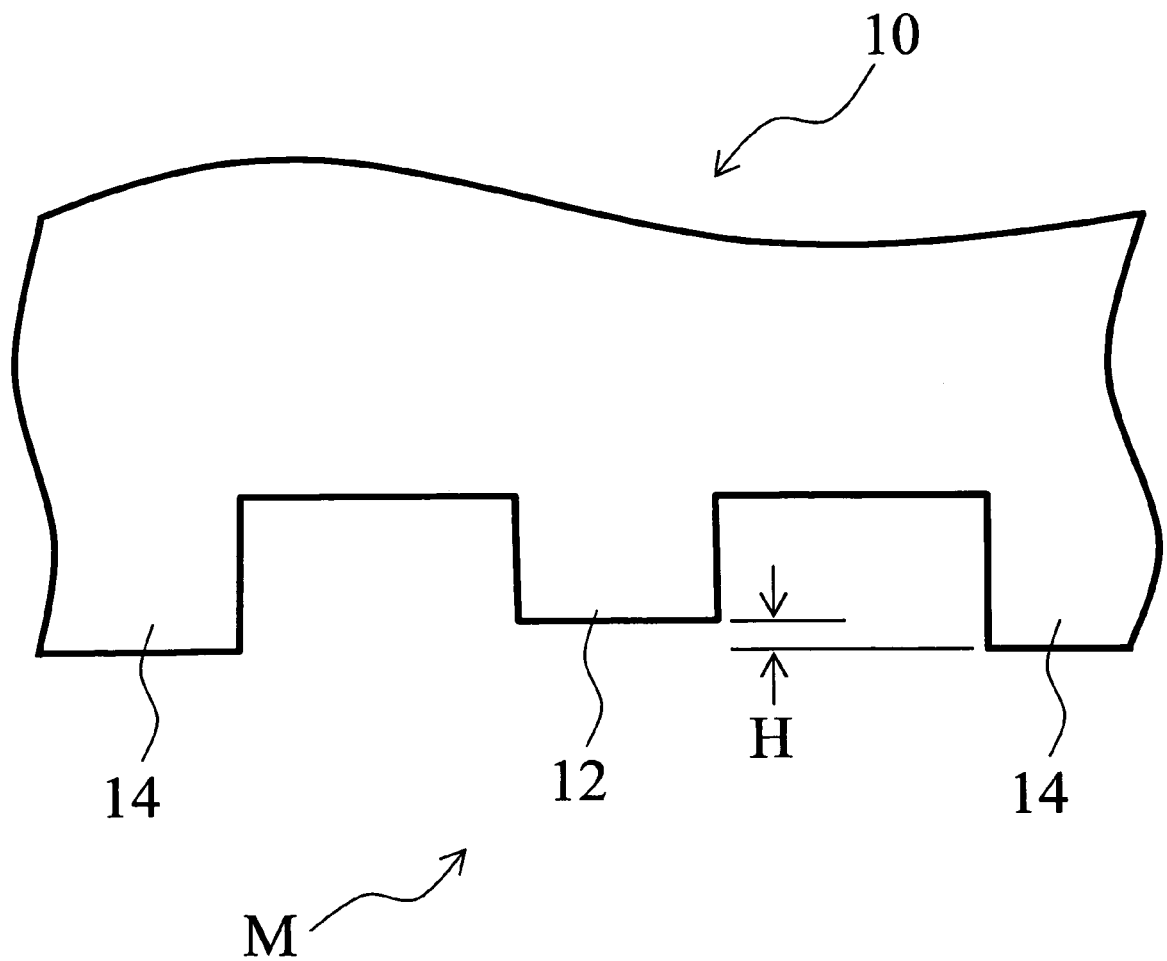
FIG. 8 is a partial enlarged cross-sectional view showing a variation of the light emitting device of the first embodiment of the invention.

FIG. 8 is a partial enlarged cross-sectional view showing a variation of the light emitting device of the first embodiment. That is, this figure corresponds to the line A-A cross section in FIG. 2.

In the light emitting device of this specific example, in the mounting surface M, the ridge stripe 12 is formed lower than the dummy ridges 14 by height H. As described in detail later, this height difference may inevitably occur in the structure of concentrating current on the ridge stripe 12, for example.

When the ridge stripe 12 is lower than the surrounding dummy ridges 14 like this, air involved in the solder layer below the ridge stripe 12 is difficult to escape at the time of mounting, and void V tends to be formed as illustrated in FIG. 32.

On the contrary, according to this embodiment, an escape route of air is provided and generation of void V can be prevented by providing a slit 16 as illustrated in FIG. 5. As a result, the light emitting device 10 can be firmly bonded to achieve good thermal contact.

Figure 9:
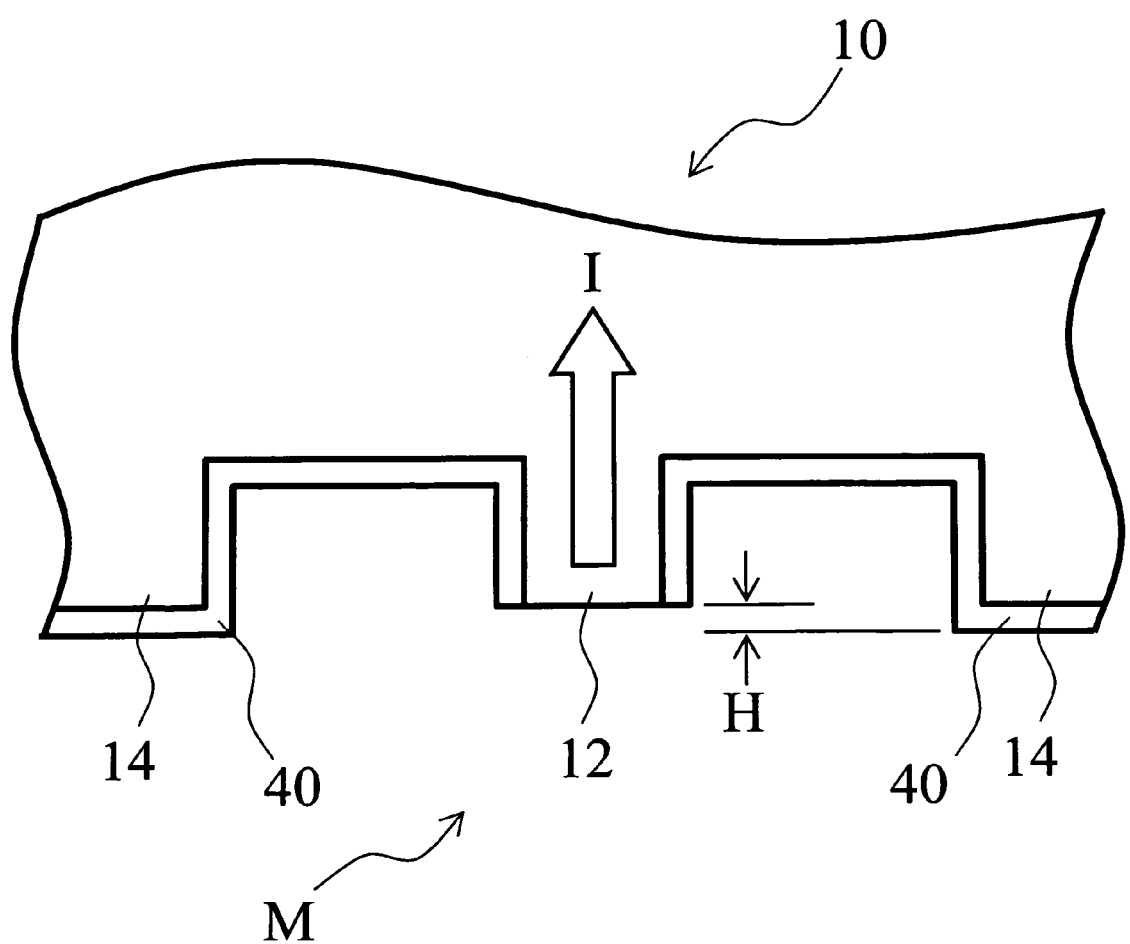
FIG. 9 is a partial enlarged cross-sectional view showing a specific example having a structure of a lowered ridge stripe 12.

FIG. 9 is a partial enlarged cross-sectional view showing a specific example having a structure of a lowered ridge stripe 12. That is, this figure also corresponds to the line A-A cross section in FIG. 2.

In the light emitting device of this specific example, an insulating layer 40 is provided in the range from the side surface of the ridge stripe 12 to the top surface of the dummy ridges 14. The insulating layer 40 may be made of, for example, dielectric material such as silicon oxides and silicon nitrides, or high resistance semiconductors. Provision of such an insulating layer 40 can block injection of current via the dummy ridges 14. In other words, as shown in FIG. 9, in the mounting surface M, current I can be injected only into the ridge stripe 12 to cause light emission only in the close vicinity of the waveguide, which leads to the laser output with high efficiency.

Figure 10:
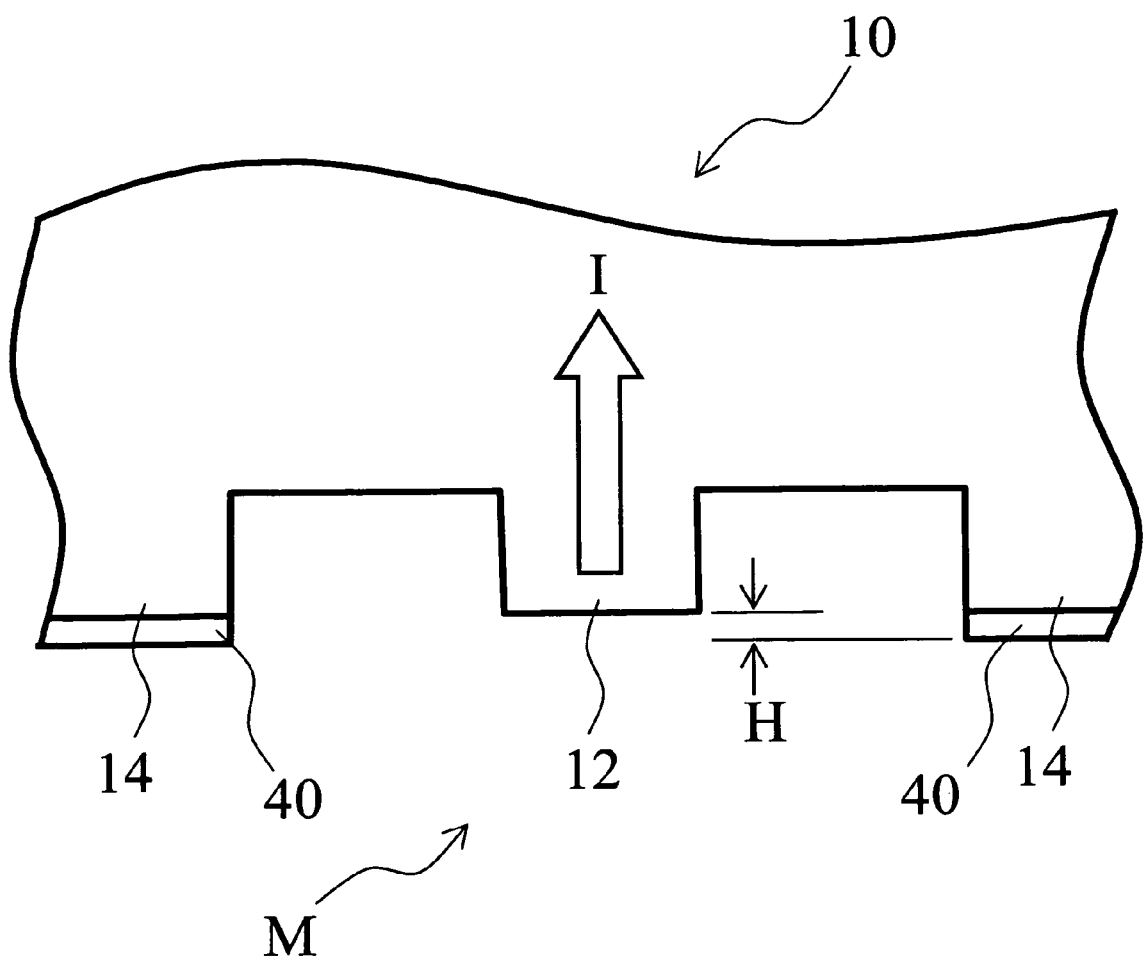
FIG. 10 is a partial enlarged cross-sectional view showing a second specific example having a structure of a lowered ridge stripe 12.

FIG. 10 is a partial enlarged cross-sectional view showing a second specific example having a structure of a lowered ridge stripe 12. That is, this figure also corresponds to the line A-A cross section in FIG. 2.

In the light emitting device of this specific example, an insulating layer 40 is provided only on the top surface of the dummy ridges 14. Provision of an insulating layer 40 like this can also cause current I to be injected only into the ridge stripe 12. That is, light emission is caused only in the close vicinity of the waveguide, and thereby the laser output can be obtained with high efficiency.

Figure 11:
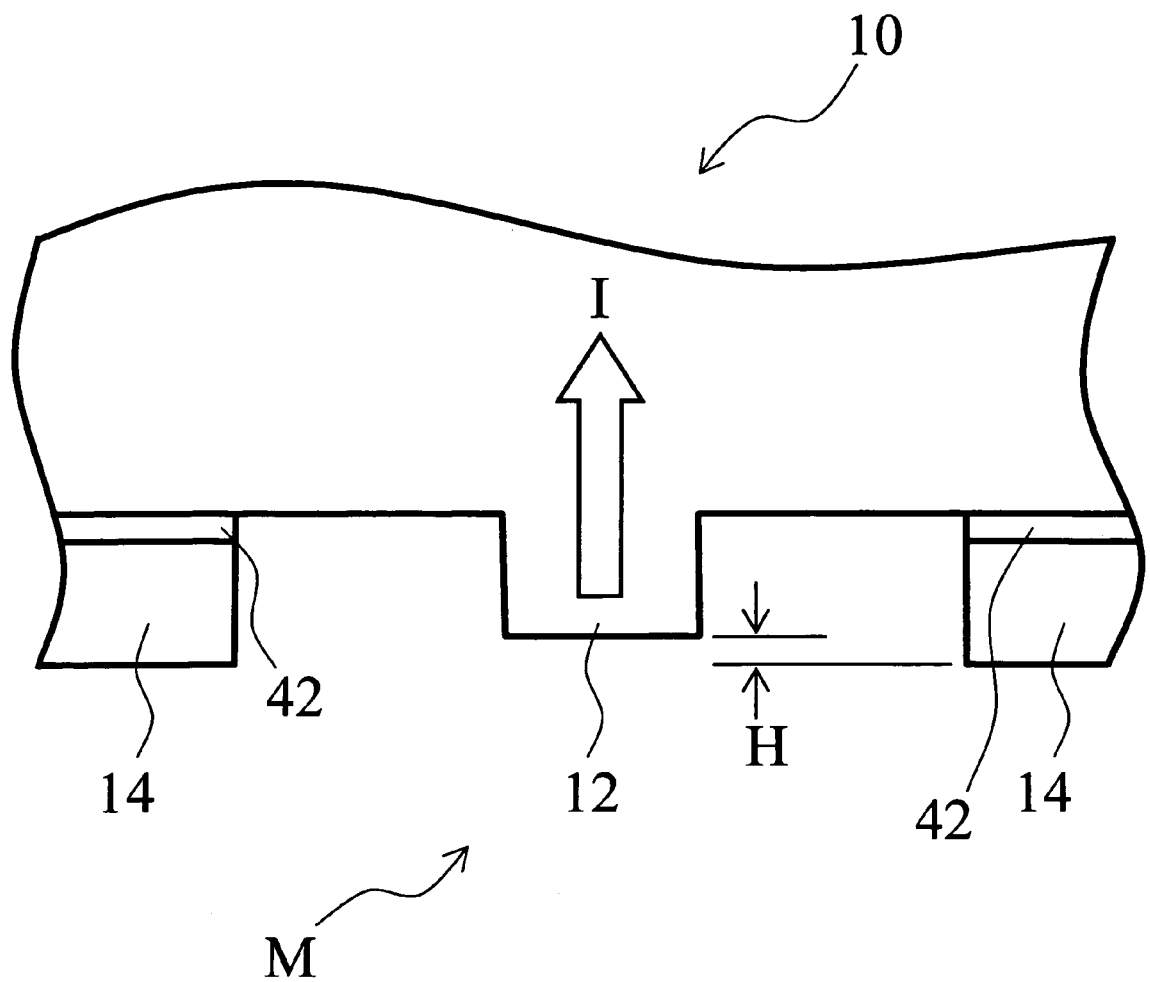
FIG. 11 is a partial enlarged cross-sectional view showing a third specific example having a structure of a lowered ridge stripe 12.

FIG. 11 is a partial enlarged cross-sectional view showing a third specific example having a structure of a lowered ridge stripe 12. That is, this figure also corresponds to the line A-A cross section in FIG. 2.

In the light emitting device of this specific example, a current blocking layer 42 is provided only in the basal portion of the dummy ridges 14. The current blocking layer 42 can be formed, for example, with high resistance semiconductors, or as a structure including a p-n junction to which reverse bias is applied during laser operation. Provision of a current blocking layer 42 like this can also cause current I to be injected only into the ridge stripe 12. That is, light emission is caused only in the close vicinity of the waveguide, and thereby the laser output can be obtained with high efficiency.

Here, as described above with reference to FIG. 8, when the ridge stripe 12 is lowered by an amount of the thickness H of the insulating layer 40 or the current blocking layer 42, void V tends to be formed in that portion of the solder layer. On the contrary, according to this embodiment, an escape route of air is provided and generation of void V can be prevented by providing a slit 16 as illustrated in FIG. 5. As a result, the light emitting device 10 can be firmly bonded to achieve good thermal contact.

Figure 12:
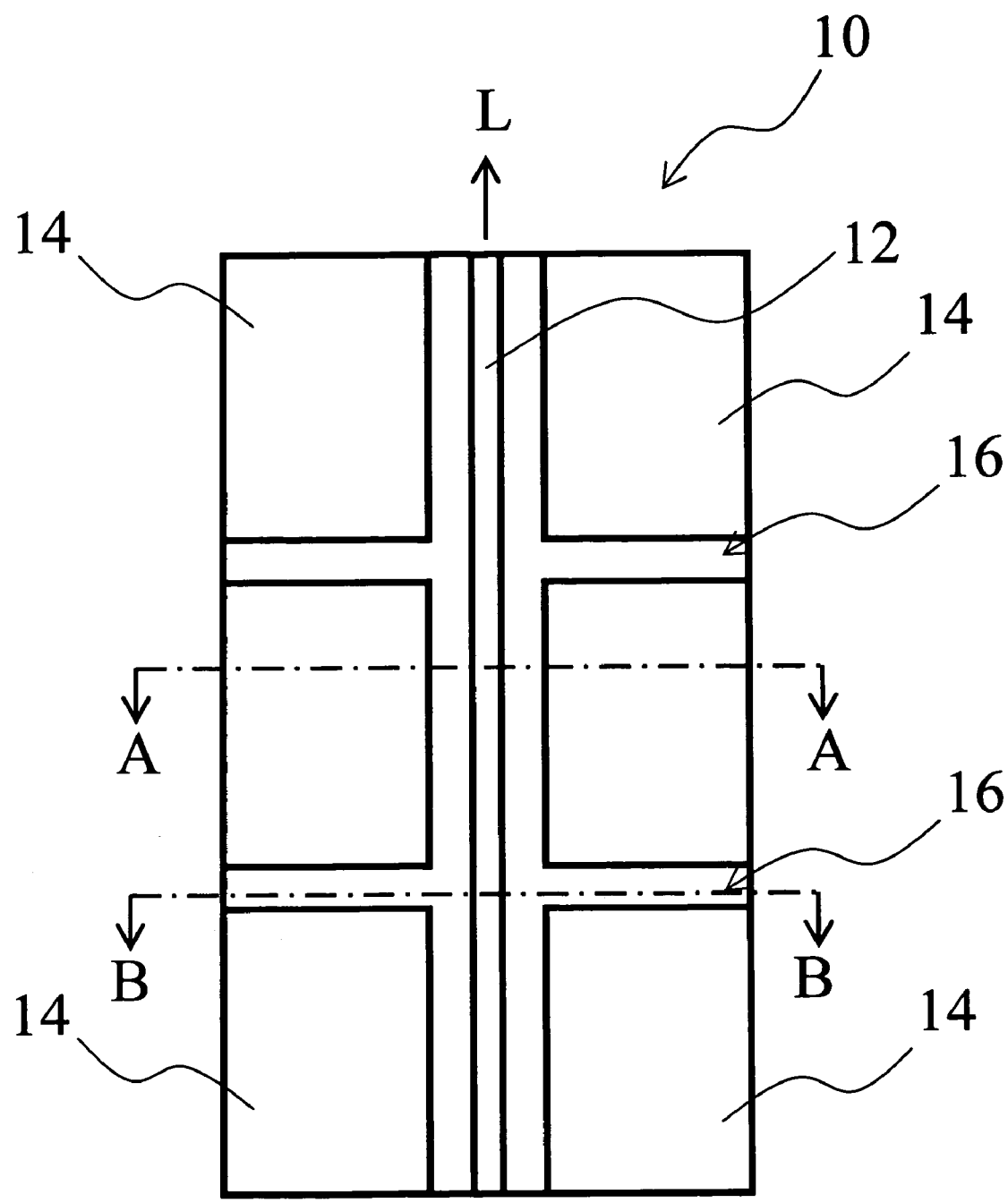
FIG. 12 is a plan view of a semiconductor light emitting device according to a second embodiment of the invention as viewed from its mounting surface.

FIG. 12 is a plan view of a semiconductor light emitting device according to a second embodiment of the invention as viewed from its mounting surface.

Figure 13:
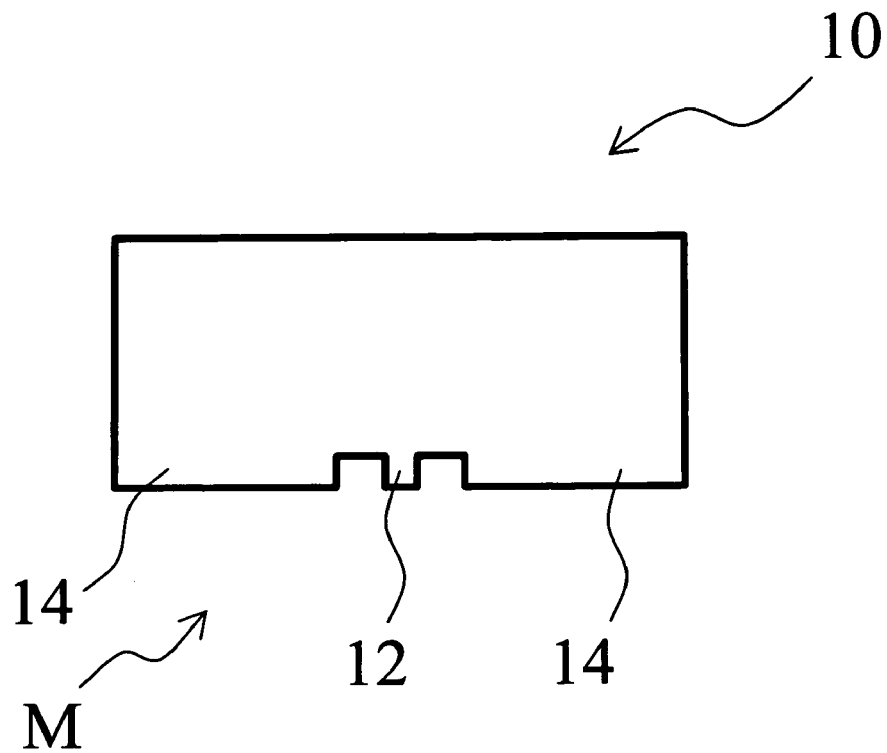
FIG. 13 is a cross-sectional view along line A-A in FIG. 12.
Figure 14:
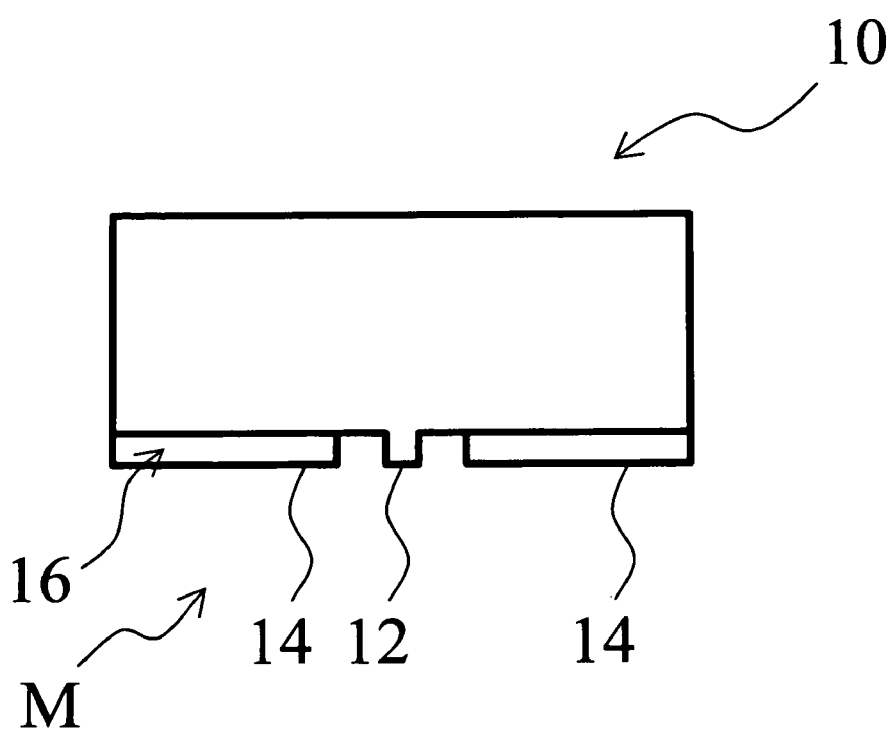
FIG. 14 is a cross-sectional view along line B-B in FIG. 12.

FIG. 13 is a cross-sectional view along line A-A in FIG. 12, and FIG. 14 is a cross-sectional view along line B-B in FIG. 12. With respect to these figures, elements similar to those described with reference to FIGS. 1 to 11 are marked with the same numerals and are not described in detail.

In this specific example, two slits 16 are provided on both sides of the ridge stripe 12, respectively. That is, two routes for ejecting air out of the solder layer at the time of mounting are provided on both sides of the ridge stripe 12, respectively. This promotes the "escape" of air from the solder layer and can prevent formation of void V more reliably.

It should be noted that if the number of slits 16 is further increased, the "escape" of air can be further promoted. That is, as long as the stress dispersion effect of the dummy ridges 14 is maintained, the number of slits 16 can be increased to suppress formation of void V more reliably, which leads to a semiconductor laser device with high performance.

Figure 15:
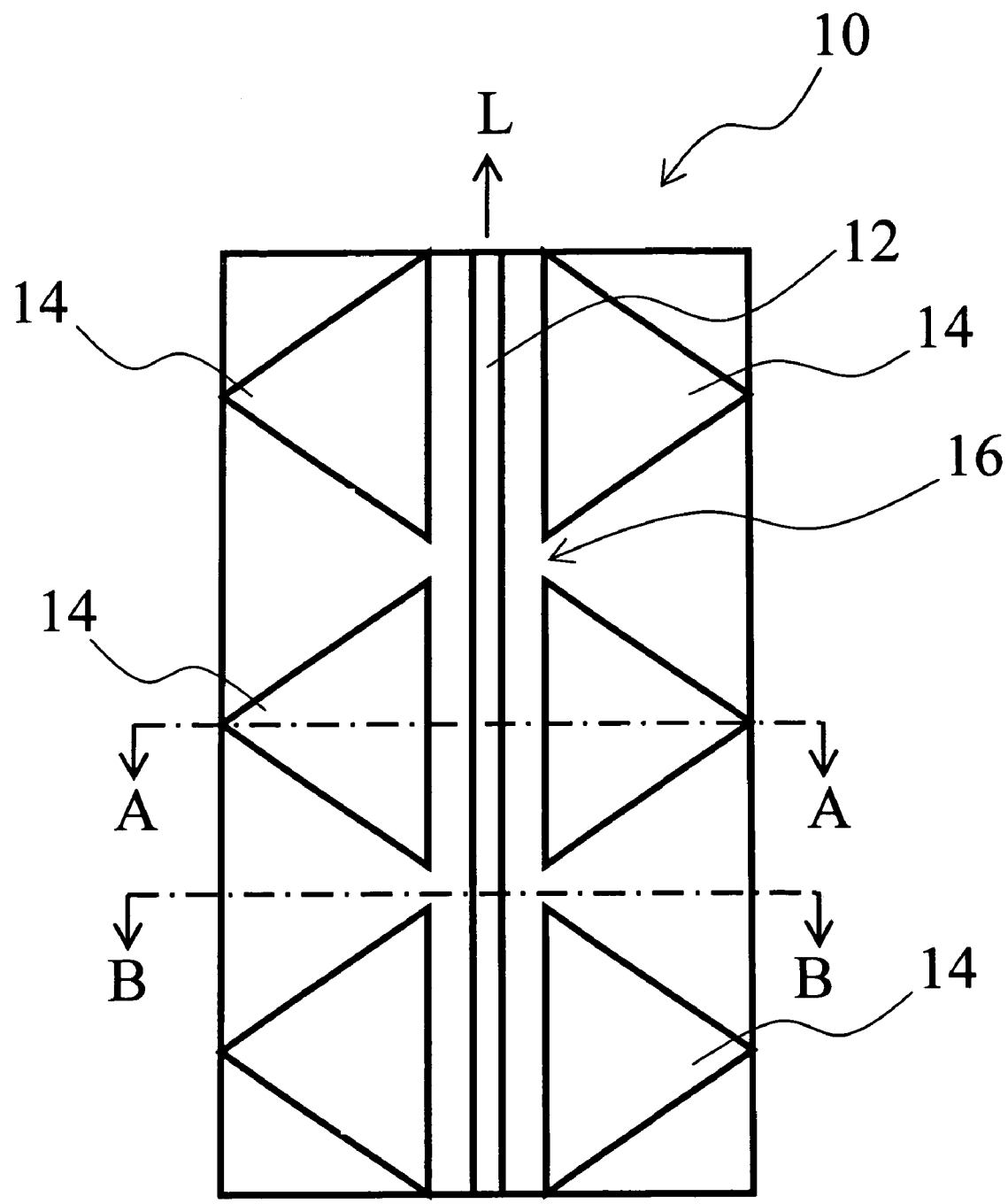
FIG. 15 is a plan view of a semiconductor light emitting device according to a third embodiment of the invention as viewed from its mounting surface.

FIG. 15 is a plan view of a semiconductor light emitting device according to a third embodiment of the invention as viewed from its mounting surface. Here, the line A-A cross section in FIG. 15 is as shown in FIG. 3 or 13. The line B-B cross section in FIG. 15 is as shown in FIG. 4 or 14.

In the light emitting device of this specific example, the slits 16 are formed in a fan shape as viewed from the ridge stripe 12. That is, the slits 16 are provided so as to widen with the distance from the ridge stripe 12. Accordingly, the dummy ridge 14 is formed in a triangular shape with its base facing the ridge stripe 12.

Also in this specific example, an escape route of air is provided and generation of void V can be prevented by providing the slits 16. In addition, by forming the slit 16 in a fan shape, the conductance for the "escape" of air is increased, and thereby generation of void V in the solder layer can be suppressed more effectively.

Moreover, in this specific example, the ridge stripe 12 is sufficiently protected by forming the dummy ridge 14 in a triangular shape with its base facing the ridge stripe 12. That is, since the ridge stripe 12 is almost surrounded on its both sides by the dummy ridges 14, weight applied at the time of mounting is dispersed efficiently, and thereby the ridge stripe 12 can be protected.

Figure 16:
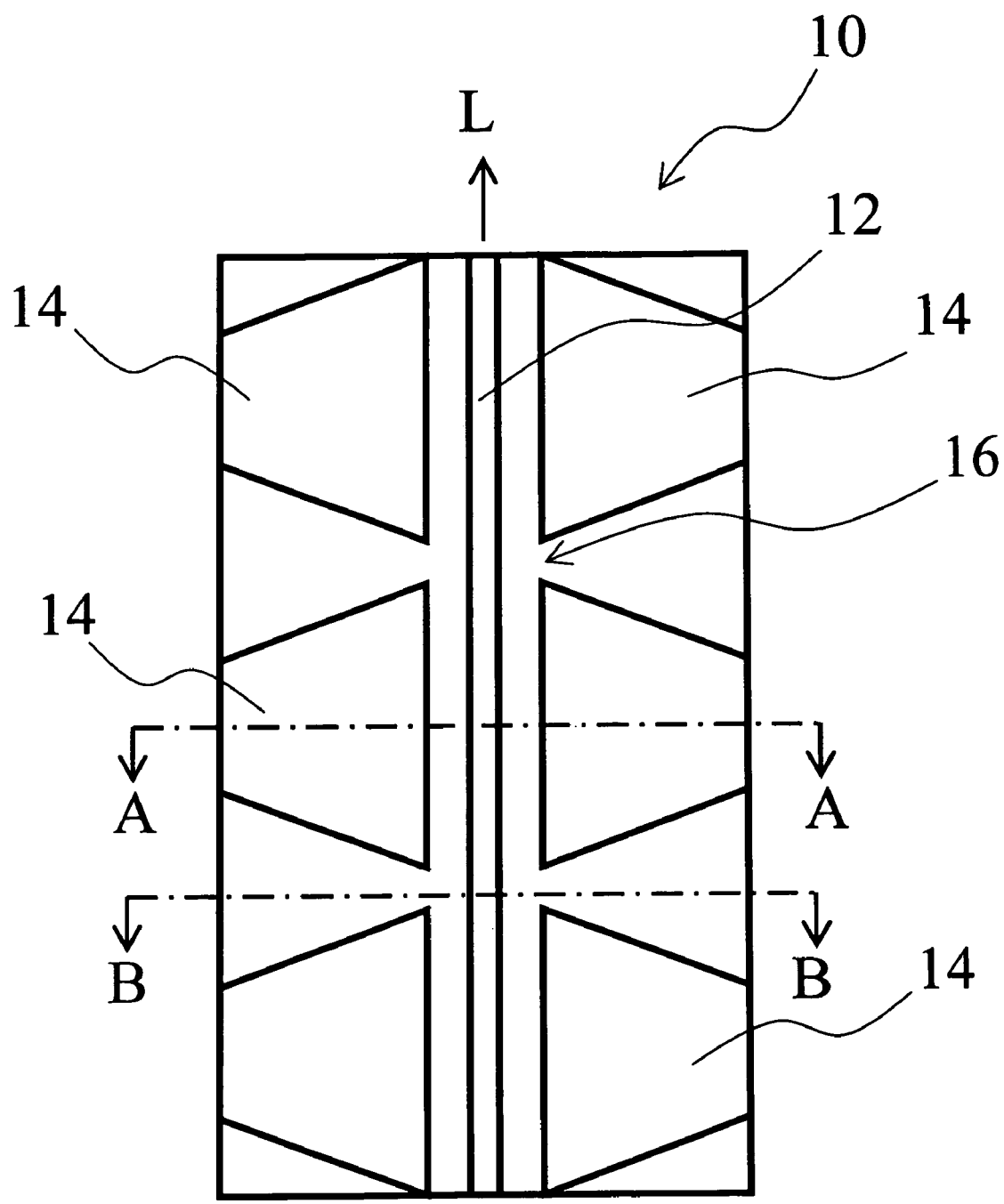
FIG. 16 is a plan view of a semiconductor light emitting device according to a fourth embodiment of the invention as viewed from its mounting surface.

FIG. 16 is a plan view of a semiconductor light emitting device according to a fourth embodiment of the invention as viewed from its mounting surface. Here, the line A-A cross section in FIG. 16 is as shown in FIG. 3 or 13. The line B-B cross section in FIG. 16 is as shown in FIG. 4 or 14.

In the light emitting device of this specific example, the slits 16 are formed in a fan shape as viewed from the ridge stripe 12, similar to the light emitting device of the third embodiment described above with reference to FIG. 15. However, the widening is smaller than that of the third embodiment. Accordingly, the dummy ridge 14 is formed in a trapezoidal shape with its base facing the ridge stripe 12.

Also in this specific example, as with the third embodiment, by forming the slit 16 in a fan shape, the conductance for the "escape" of air is increased, and thereby generation of void V in the solder layer can be suppressed more effectively. Moreover, by forming the dummy ridge 14 in a trapezoidal shape with its base facing the ridge stripe 12, the ridge stripe 12 is almost covered on its both sides with the dummy ridges 14. Thus weight applied at the time of mounting is dispersed efficiently, and thereby the ridge stripe 12 can be protected.

Figure 17:
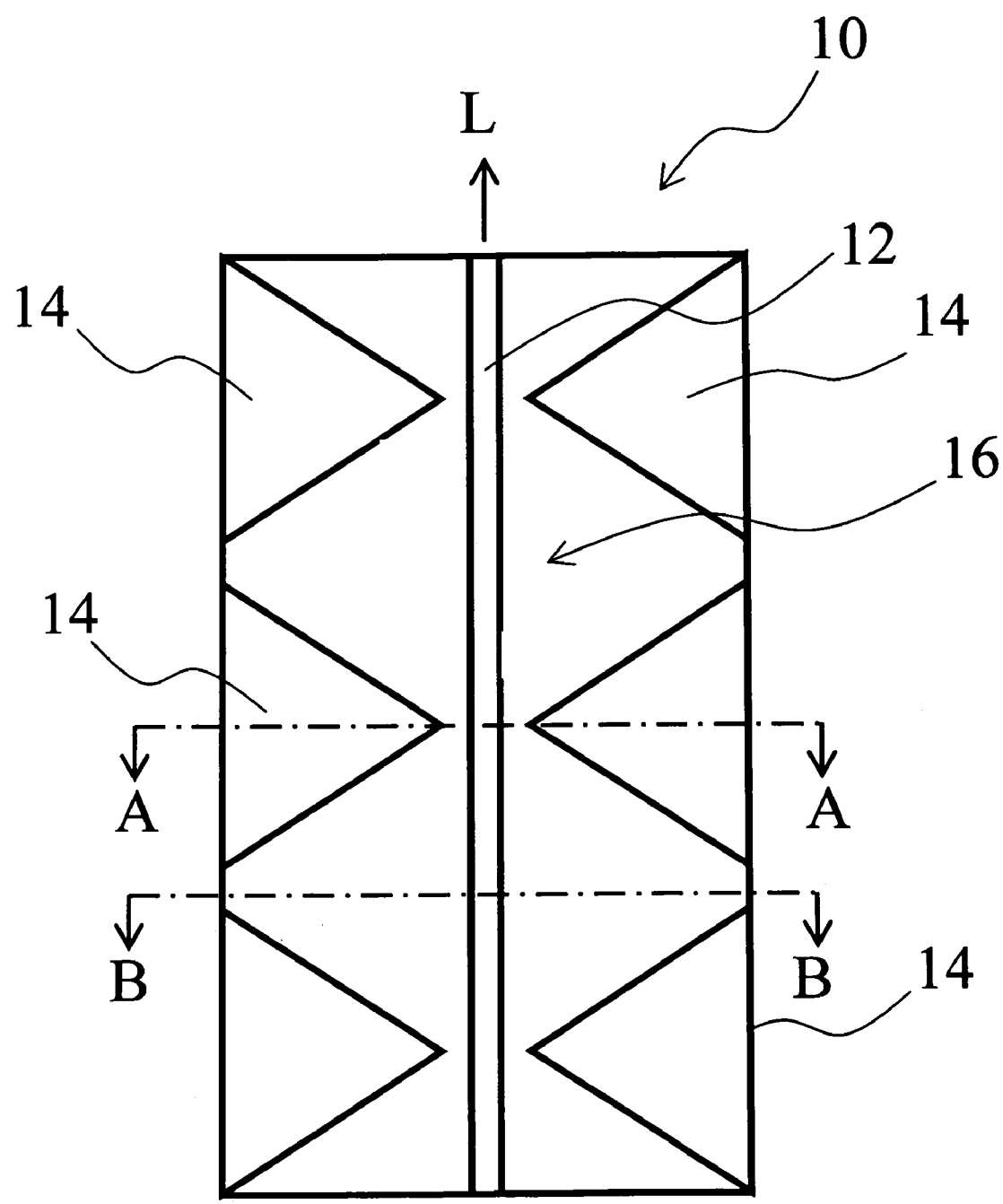
FIG. 17 is a plan view of a semiconductor light emitting device according to a fifth embodiment of the invention as viewed from its mounting surface.

FIG. 17 is a plan view of a semiconductor light emitting device according to a fifth embodiment of the invention as viewed from its mounting surface. Here, the line A-A cross section in FIG. 17 is as shown in FIG. 3 or 13. The line B-B cross section in FIG. 17 is as shown in FIG. 4 or 14.

In the light emitting device of this specific example, the slits 16 are formed in a reverse fan shape as viewed from the ridge stripe 12. That is, the slits 16 are provided so as to be wide near the ridge stripe 12 and narrowed with the distance from the ridge stripe 12. Accordingly, the dummy ridge 14 is formed in a triangular shape with its vertex facing the ridge stripe 12.

Also in this specific example, an escape route of air is provided and generation of void V can be prevented by providing the slits 16. In addition, according to this specific example, by forming the slit 16 in a reverse fan shape, the effect of moving the air layer below the ridge stripe 12 to the slit 16 is promoted. That is, since the protrusion of the dummy ridge 14 is reduced around the ridge stripe 12, the air layer below the ridge stripe 12 tends to be pushed out toward the slit 16 when weight is applied at the time of mounting. As a result, formation of void V below the ridge stripe 12 can be prevented more reliably.

Figure 18:
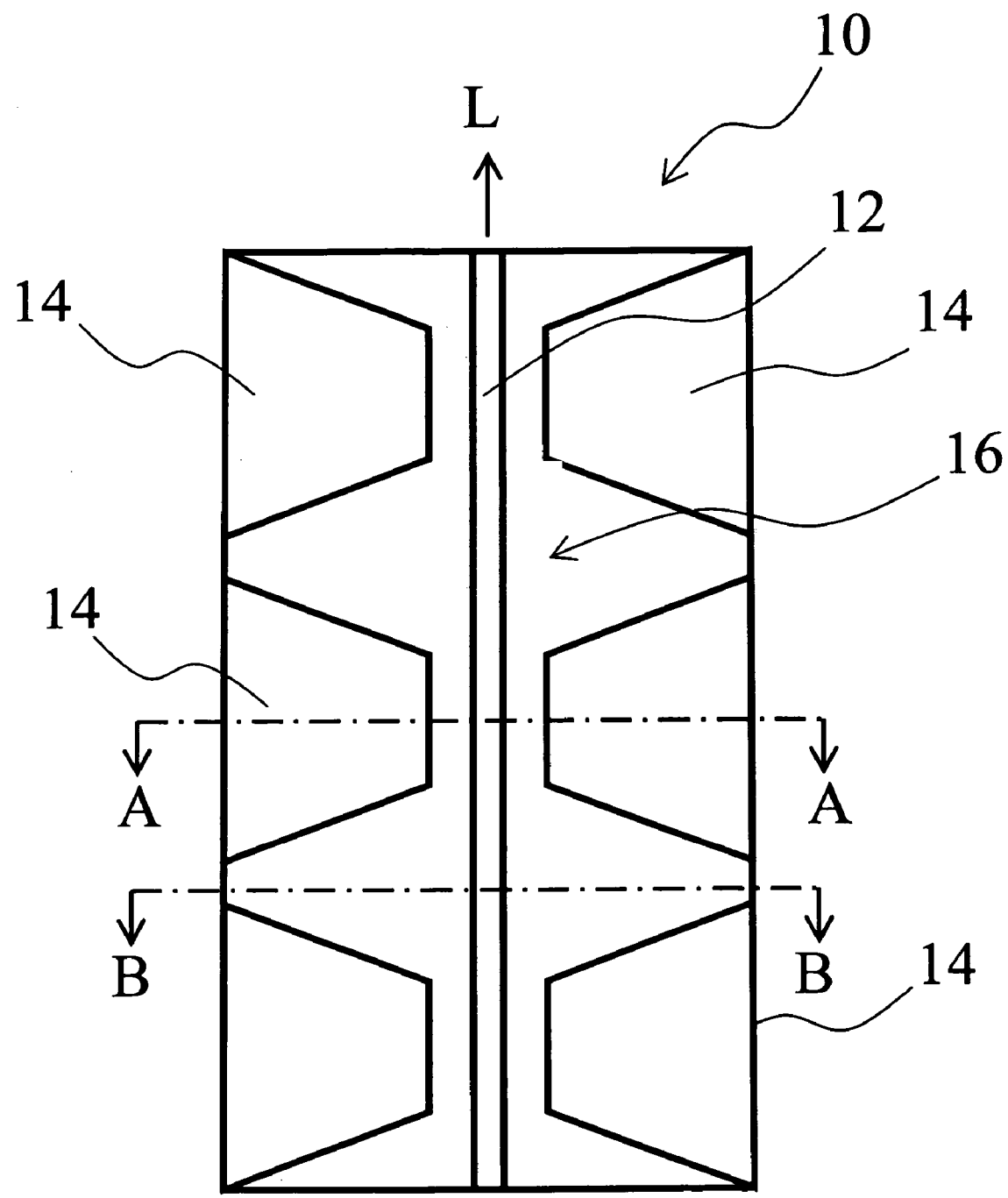
FIG. 18 is a plan view of a semiconductor light emitting device according to a sixth embodiment of the invention as viewed from its mounting surface.

FIG. 18 is a plan view of a semiconductor light emitting device according to a sixth embodiment of the invention as viewed from its mounting surface. Here, the line A-A cross section in FIG. 18 is as shown in FIG. 3 or 13. The line B-B cross section in FIG. 18 is as shown in FIG. 4 or 14.

In the light emitting device of this specific example, the slits 16 are formed in a reverse fan shape as viewed from the ridge stripe 12, similar to the light emitting device of the fifth embodiment described above with reference to FIG. 17. However, the widening is smaller than that of the fifth embodiment. Accordingly, the dummy ridge 14 is formed in a trapezoidal shape with its upper side facing the ridge stripe 12.

Also in this specific example, as with the fifth embodiment, by forming the slit 16 in a reverse fan shape, the effect of moving the air layer below the ridge stripe 12 to the slit 16 is promoted. In addition, by forming the dummy ridge 14 in a trapezoidal shape, the area of the dummy ridge 14 can be increased relative to the fifth embodiment to enhance the stress dispersion effect.

Figure 19:
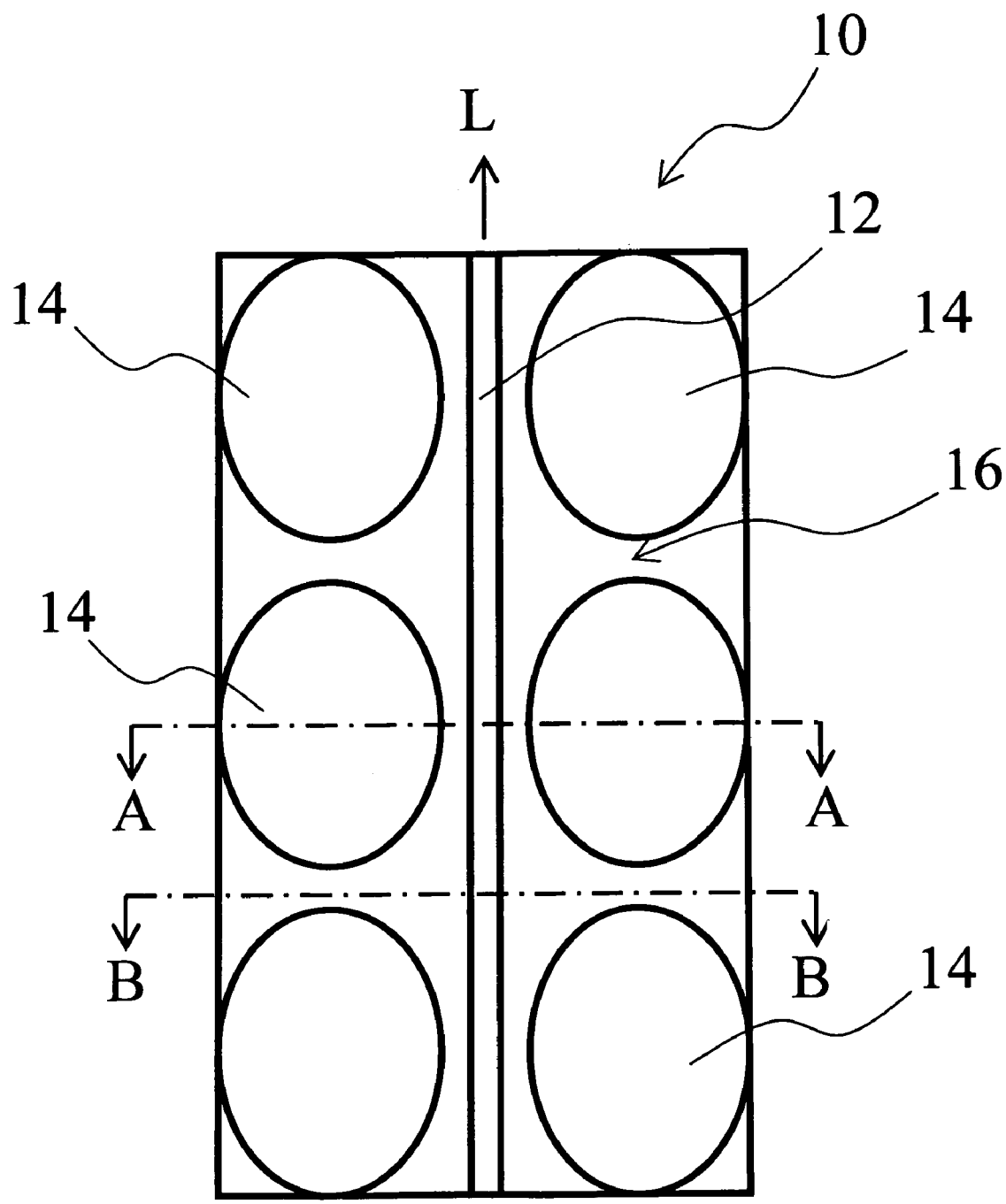
FIG. 19 is a plan view of a semiconductor light emitting device according to a seventh embodiment of the invention as viewed from its mounting surface.

FIG. 19 is a plan view of a semiconductor light emitting device according to a seventh embodiment of the invention as viewed from its mounting surface. Here, the line A-A cross section in FIG. 19 is as shown in FIG. 3 or 13. The line B-B cross section in FIG. 19 is as shown in FIG. 4 or 14.

In the light emitting device of this specific example, the dummy ridge 14 is formed in a plurality of elliptic patterns, and the slit 16 is formed as a gap between the elliptic dummy ridges 14. When the dummy ridge 14 is formed in an elliptic or circular shape, the escape route of air from the ridge stripe 12 is also formed in a circular shape, which facilitates the "escape" of air. At the same time, a sufficient area of the dummy ridge 14 is provided to achieve the stress dispersion effect easily.

Figure 20:
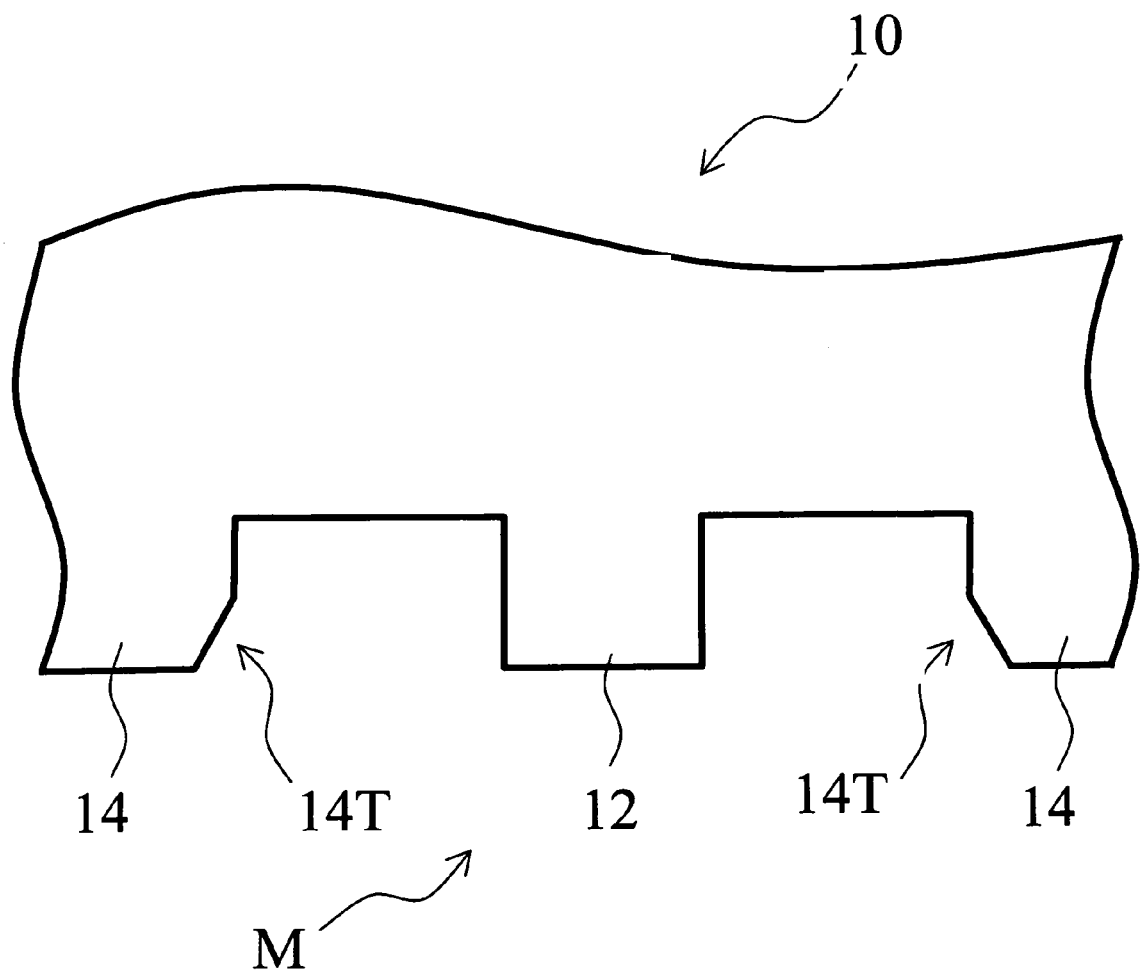
FIGS. 20 and 21 are partial enlarged cross-sectional views of a semiconductor light emitting device according to an eighth embodiment of the invention.
Figure 21:
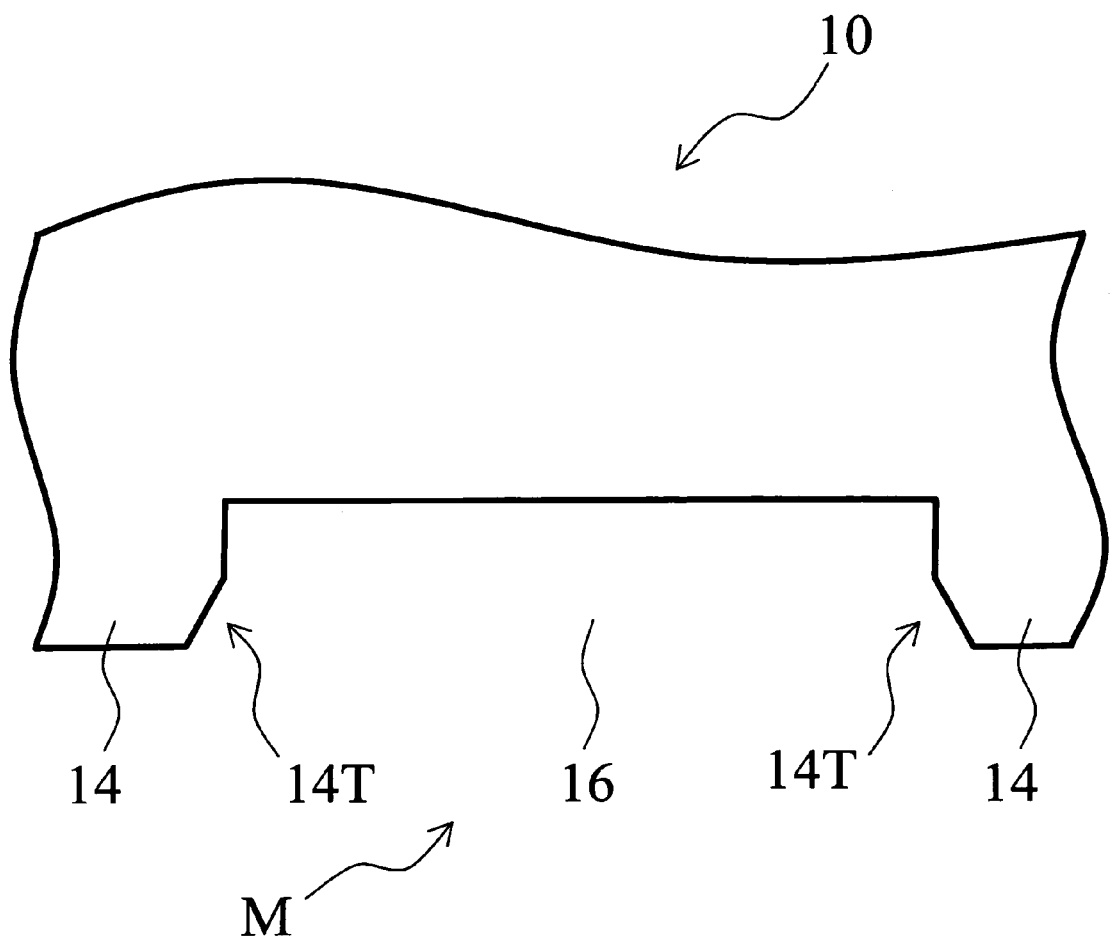

FIGS. 20 and 21 are partial enlarged cross-sectional views of a semiconductor light emitting device according to an eighth embodiment of the invention. That is, FIG. 20 is a cross-sectional view in the vertical direction relative to the ridge stripe 12, and corresponds to the line A-A cross section in FIG. 2, 12, or 15, for example.

FIG. 21 is a cross-sectional view in the vertical direction relative to the slit 16.

The semiconductor light emitting device of this embodiment comprises taper portions 14T partly on the side surface of the dummy ridges 14.

As shown in FIG. 20, when such a taper portion 14T is provided on the side surface of the dummy ridge 14 facing the ridge stripe 12, that portion is recessed as viewed from the ridge stripe 12, which can promote movement of air from the ridge stripe 12.

In addition, as shown in FIG. 21, when a taper portion 14T is provided on the side surface of the dummy ridge 14 around the slit 16, the escape route of air can be virtually expanded, which can promote the "escape" of air.

Figure 22:
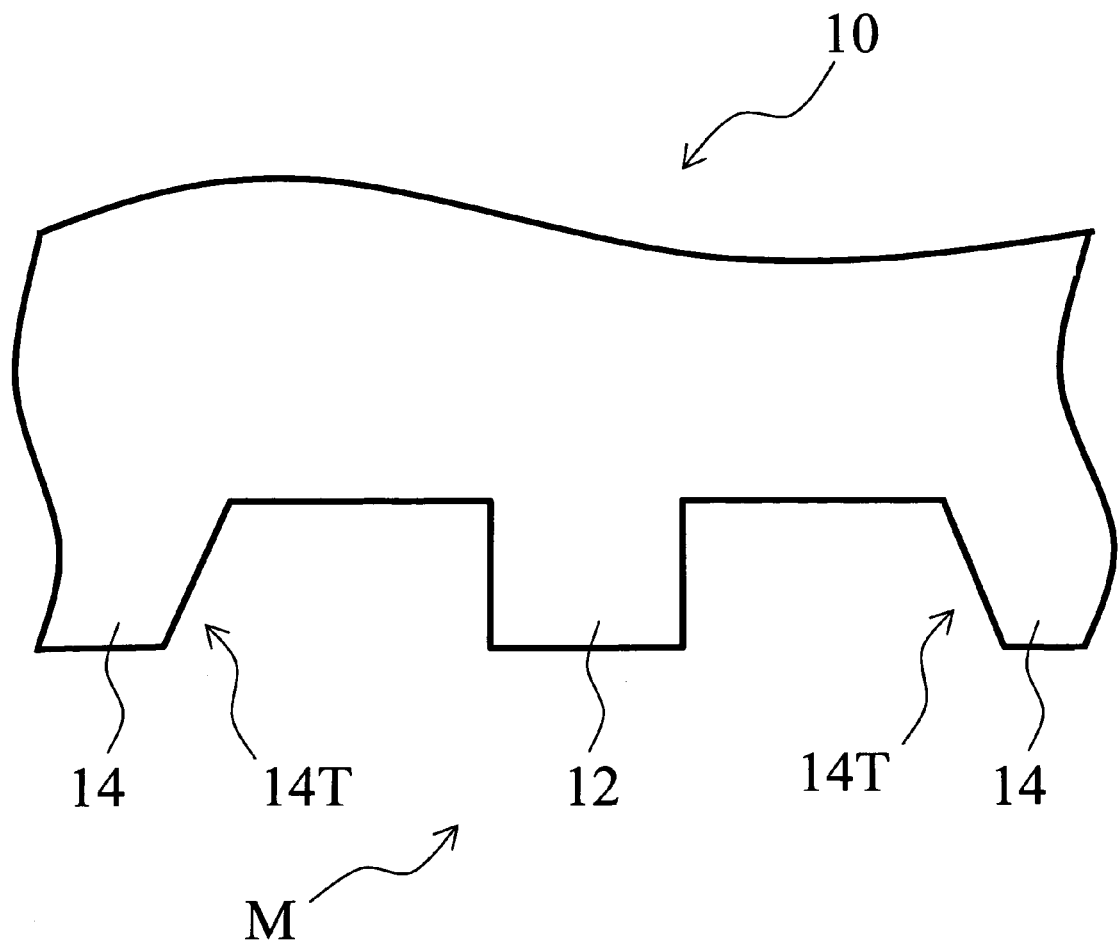
FIGS. 22 and 23 are partial enlarged cross-sectional views of a semiconductor light emitting device according to a ninth embodiment of the invention.
Figure 23:
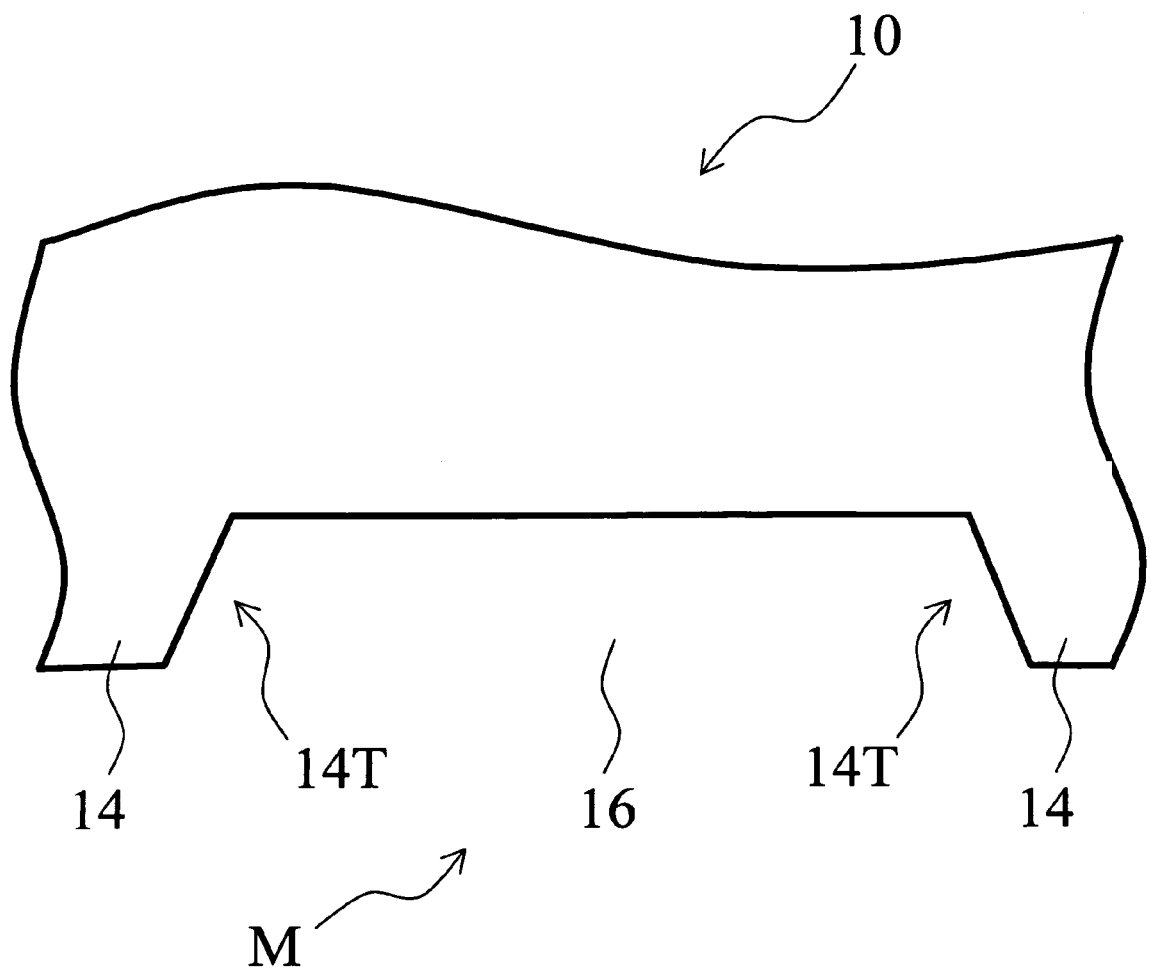

FIGS. 22 and 23 are partial enlarged cross-sectional views of a semiconductor light emitting device according to a ninth embodiment of the invention. That is, FIG. 22, as with FIG. 20, is a cross-sectional view in the vertical direction relative to the ridge stripe 12, and corresponds to the line A-A cross section in FIG. 2, 12, or 15, for example.

FIG. 23, as with FIG. 21, is a cross-sectional view in the vertical direction relative to the slit 16.

The semiconductor light emitting device of this embodiment comprises taper portions 14T entirely on the side surface of the dummy ridges 14. Therefore, the function and effect of the eighth embodiment described above with reference to FIGS. 20 and 21 can be further enhanced.

EXAMPLE

Embodiments of the invention will now be described in further detail with reference to an example.

Figure 24:
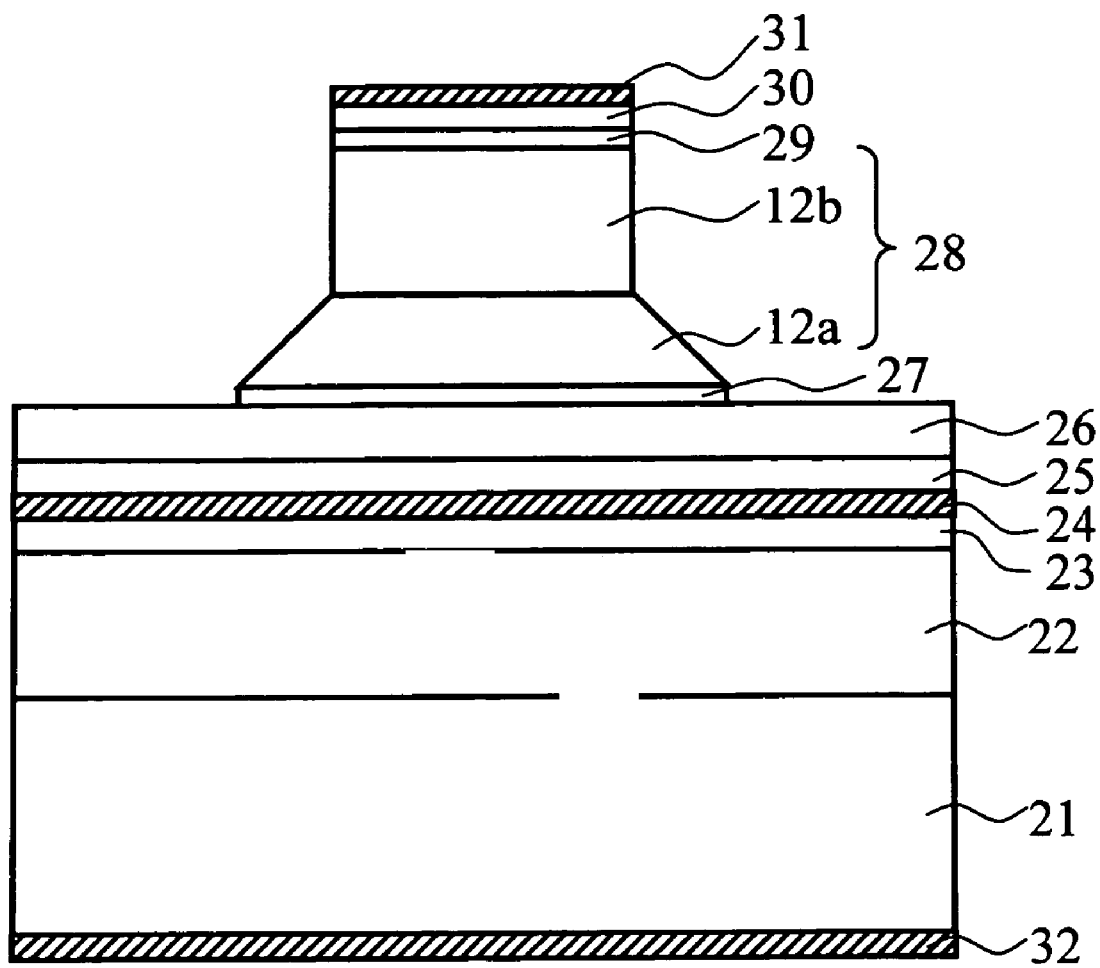
FIG. 24 shows a cross-sectional structure of a relevant part of the semiconductor light emitting device as an example of the invention.

FIG. 24 shows a cross-sectional structure of a relevant part of the semiconductor light emitting device as an example of the invention. More specifically, this figure shows a cross section near the ridge stripe 12 of a semiconductor laser.

The semiconductor laser of this example is a ridge-waveguide type semiconductor laser that can oscillate around a wavelength of 650 nm. On an n-type GaAs substrate 21, an n-type $In_{0.5}(Ga_{0.3}Al_{0.7})_{0.5}P$ lower cladding layer 22, $In_{0.5}(Ga_{0.5}Al_{0.5})_{0.5}P$ optical guide layer 23, InGaP/InGaAlP MQW (Multiple Quantum Well) active layer 24, $IN_{0.5}(Ga_{0.5}Al_{0.5})_{0.5}P$ optical guide layer 25, p-type $In_{0.5}(Ga_{0.3}Al_{0.7})_{0.5}P$ upper first cladding layer 26, p-type $In_{0.5}Ga_{0.5}P$ etching stopper layer 27, p-type $In_{0.5}(Ga_{0.3}Al_{0.7})_{0.5}P$ upper second cladding layer 28, p-type $In_{0.5}Ga_{0.5}P$ intermediate layer 29, and p-type GaAs contact layer 30 are stacked in this order.

The second cladding layer 28 is patterned like a stripe to form a ridge stripe 12. The ridge stripe 12 has a sloped portion 12a having sloped side surfaces, and a vertical portion 12b having generally vertical side surfaces on the sloped portion 12a. A p-side electrode 31 is formed above the contact layer 30, and an n-side electrode 32 is formed on the rear side of the substrate 21.

Next, a method of manufacturing a semiconductor laser of this example will be described.

Figure 25A:
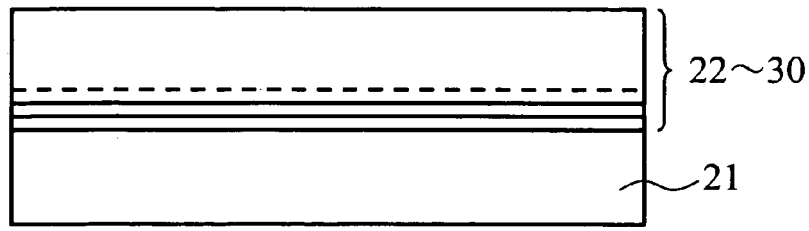
FIGS. 25 and 26 are process cross-sectional views showing part of the semiconductor laser of the example of the invention.
Figure 25B:
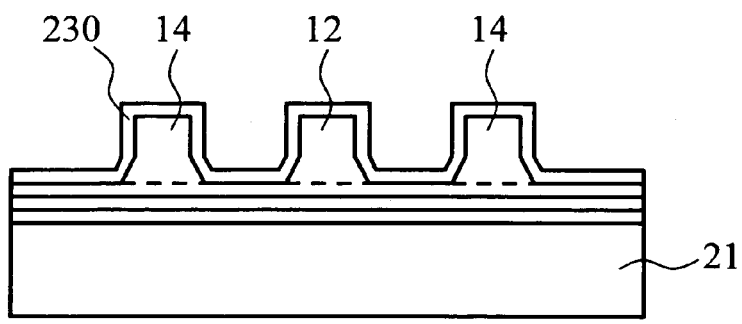
Figure 25C:
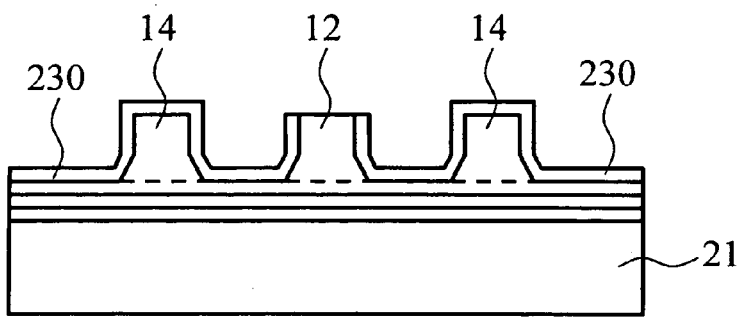
Figure 25D:
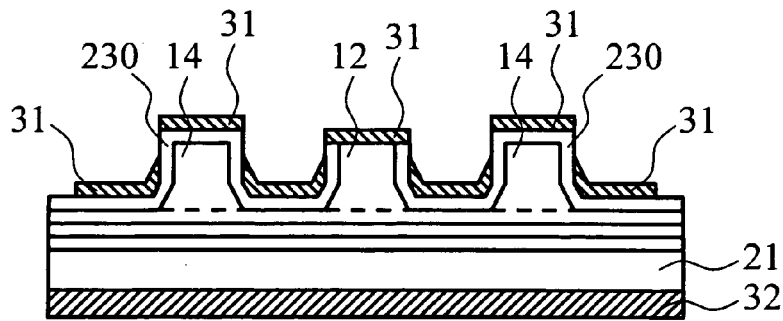
Figure 26:
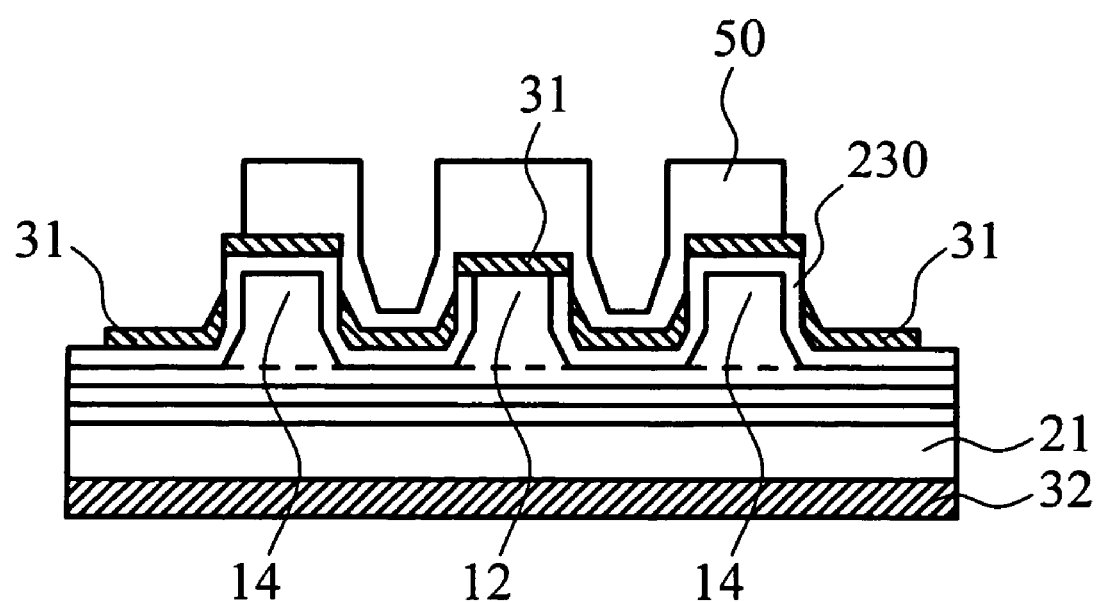

FIGS. 25 and 26 are process cross-sectional views showing part of the semiconductor laser of this example.

First, as shown in FIG. 25A, a layered structure comprising a series of layers from the InGaAlP cladding layer 22 to the GaAs contact layer 30 is formed on the n-type GaAs substrate 21.

Next, a ridge stripe and dummy ridges are formed by known techniques such as dry etching, wet etching, and sidewall techniques. At this time, as illustrated in FIGS. 2, 5, 12, and 15, the dummy ridges 14 are not continuously formed along the longitudinal direction of the ridge stripe 12, but slits 16 are provided as appropriate.

Subsequently, as shown in FIG. 25B, silicon oxide film 230 is deposited again on the entire surface of the wafer by CVD method.

Subsequently, as shown in FIG. 25C, the silicon oxide film 230 covering the top surface of the ridge stripe 12 is selectively etched away by known coating film planarization and lithography techniques to expose a contact portion extending to the top of the ridge.

After a p-side electrode 31 is formed, the rear side of the GaAs substrate 21 is polished to thin the wafer.

Next, as shown in FIG. 25D, an n-side electrode 32 is formed on the rear surface of the GaAs substrate 21.

Subsequently, as shown in FIG. 26, gold-tin 50 is applied as a solder layer, thereby completing the semiconductor laser of this example.

As described above, according to this example, a ridge-waveguide type semiconductor laser protected by dummy ridges 14 is obtained. As also shown in FIG. 25C, in the semiconductor laser of this example, silicon oxide film 230 for blocking current is formed on the top surface of the dummy ridges 14. Thus the ridge stripe 12 has a smaller height by the thickness of the silicon oxide film 230. Therefore, when this laser device is mounted in the junction down configuration, void V tends to be formed in the solder layer as described above with reference to FIG. 32. In this respect, according to this example, slits 16 are provided as appropriate on both sides of the ridge stripe 12. Thus, at the time of mounting, the "escape" of air is promoted, and formation of void V can be suppressed. As a result, it is possible to achieve a semiconductor light emitting apparatus that is bonded with physical robustness and simultaneously has a good thermal contact.

Next, a semiconductor light emitting apparatus of the embodiment of the invention will be described.

Figure 27A:
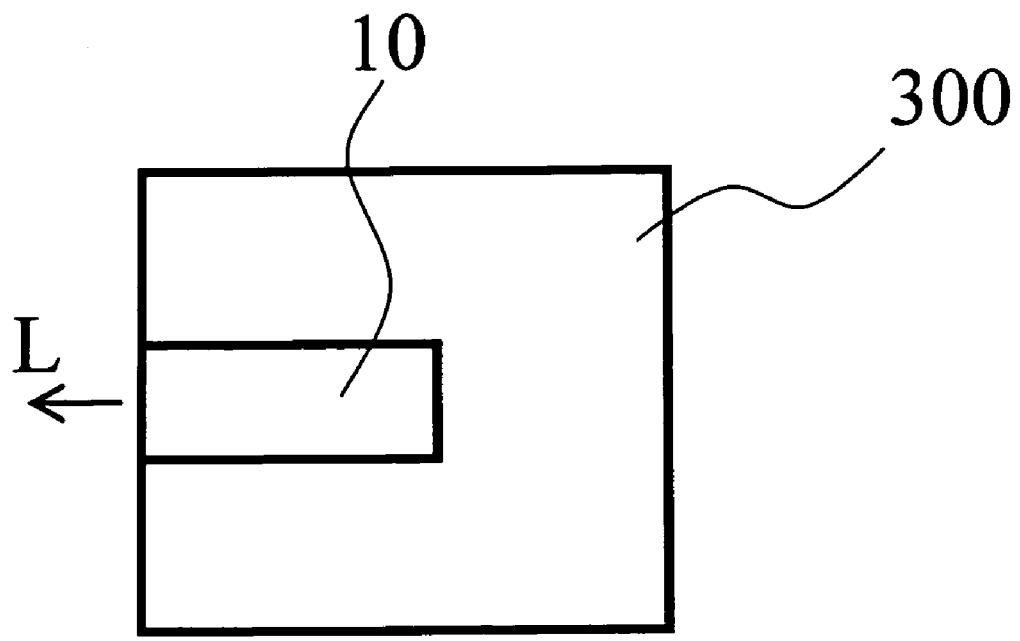
FIG. 27 is a schematic view showing an example of a semiconductor light emitting apparatus of an embodiment of the invention.
Figure 27B:
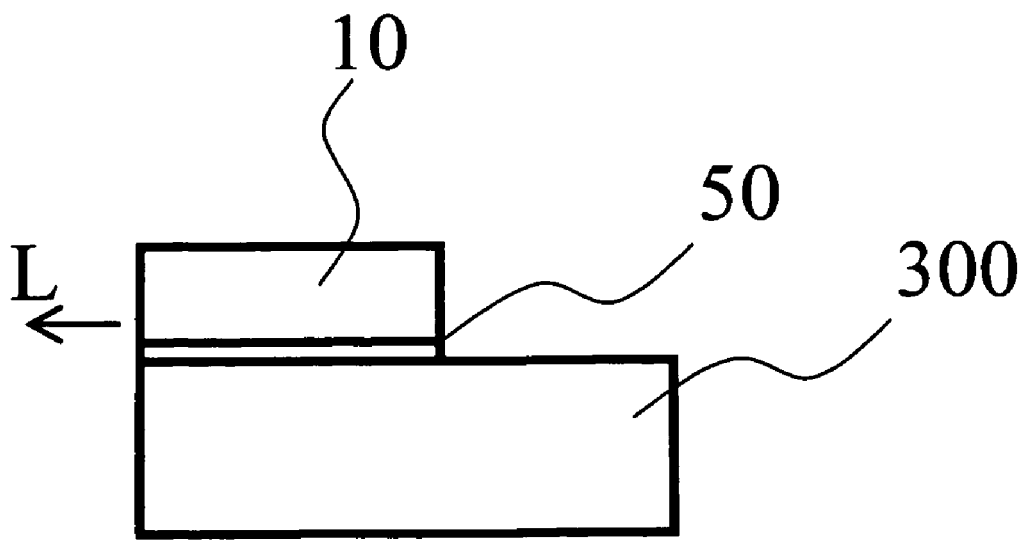

FIG. 27 is a schematic view showing an example of a semiconductor light emitting apparatus of an embodiment of the invention. That is, FIG. 27A is its plan view, and FIG. 27B is its front view.

The semiconductor light emitting apparatus of this specific example is referred to as of "chip-carrier type". More specifically, a semiconductor light emitting device 10 is mounted on a carrier 300 made of insulating material such as aluminum nitride or aluminum oxide, or semiconductors such as silicon, in the junction down configuration with solder such as gold-tin, or conductive adhesive. Laser light L is emitted from the end face near the mounting surface of the semiconductor light emitting device 10.

According to this embodiment, as described above with reference to FIGS. 1 to 26, slits 16 are provided as appropriate on the mounting surface of the semiconductor light emitting device 10 to suppress formation of void in the solder layer below the ridge stripe. It is thus possible to achieve a chip-carrier type semiconductor light emitting apparatus that has increased physical bonding strength for the chip carrier 300 and can maintain good thermal contact at the same time.

Figure 28A:
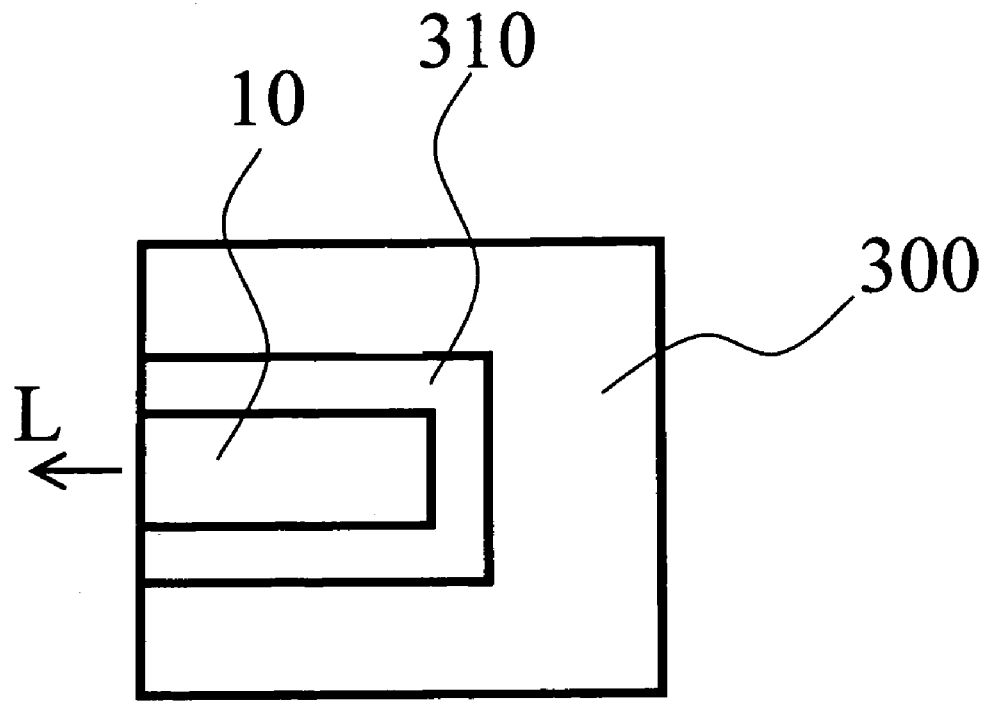
FIG. 28 is a schematic view showing a second specific example of the semiconductor light emitting apparatus of an embodiment of the invention.
Figure 28B:
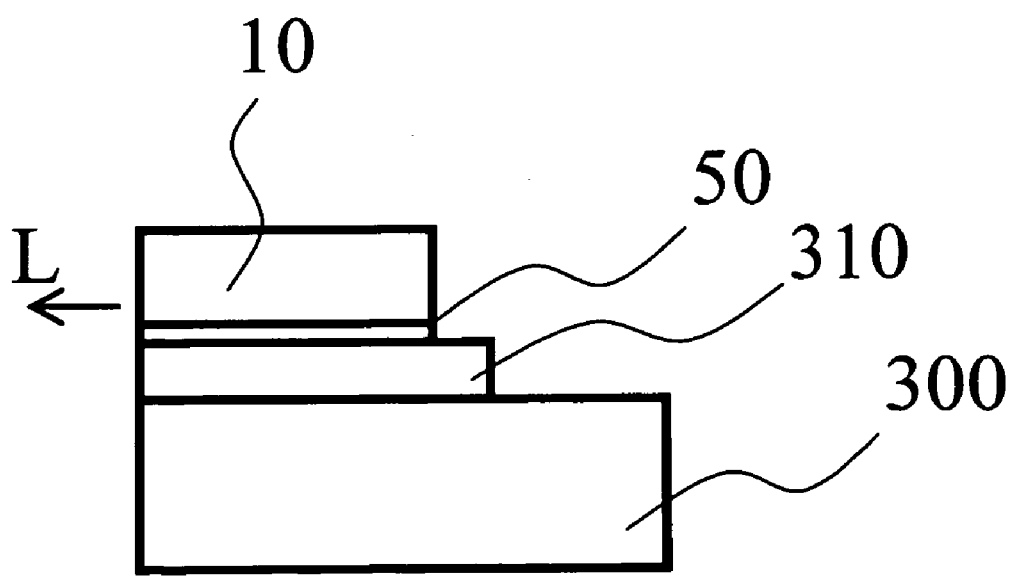

FIG. 28 is a schematic view showing a second specific example of the semiconductor light emitting apparatus of an embodiment of the invention. That is, FIG. 28A is its plan view, and FIG. 28B is its front view.

The semiconductor light emitting apparatus of this specific example is also a "chip-carrier type" apparatus. It differs from that shown in FIG. 27 in that a submount 310 is provided between the carrier 300 and the semiconductor light emitting device 10. The submount 310 serves to reduce thermal stress applied to the semiconductor light emitting device 10 by, for example, enhancing heat dissipation from the semiconductor light emitting device 10 and alleviating the difference of expansivity between the semiconductor light emitting device 10 and the carrier 300.

Also in this embodiment, as described above with reference to FIGS. 1 to 26, slits 16 are provided as appropriate on the mounting surface of the semiconductor light emitting device 10 to suppress formation of void in the solder layer below the ridge stripe. It is thus possible to achieve a chip-carrier type semiconductor light emitting apparatus that has increased physical bonding strength for the submount 310 and can maintain good thermal contact at the same time.

Figure 29:
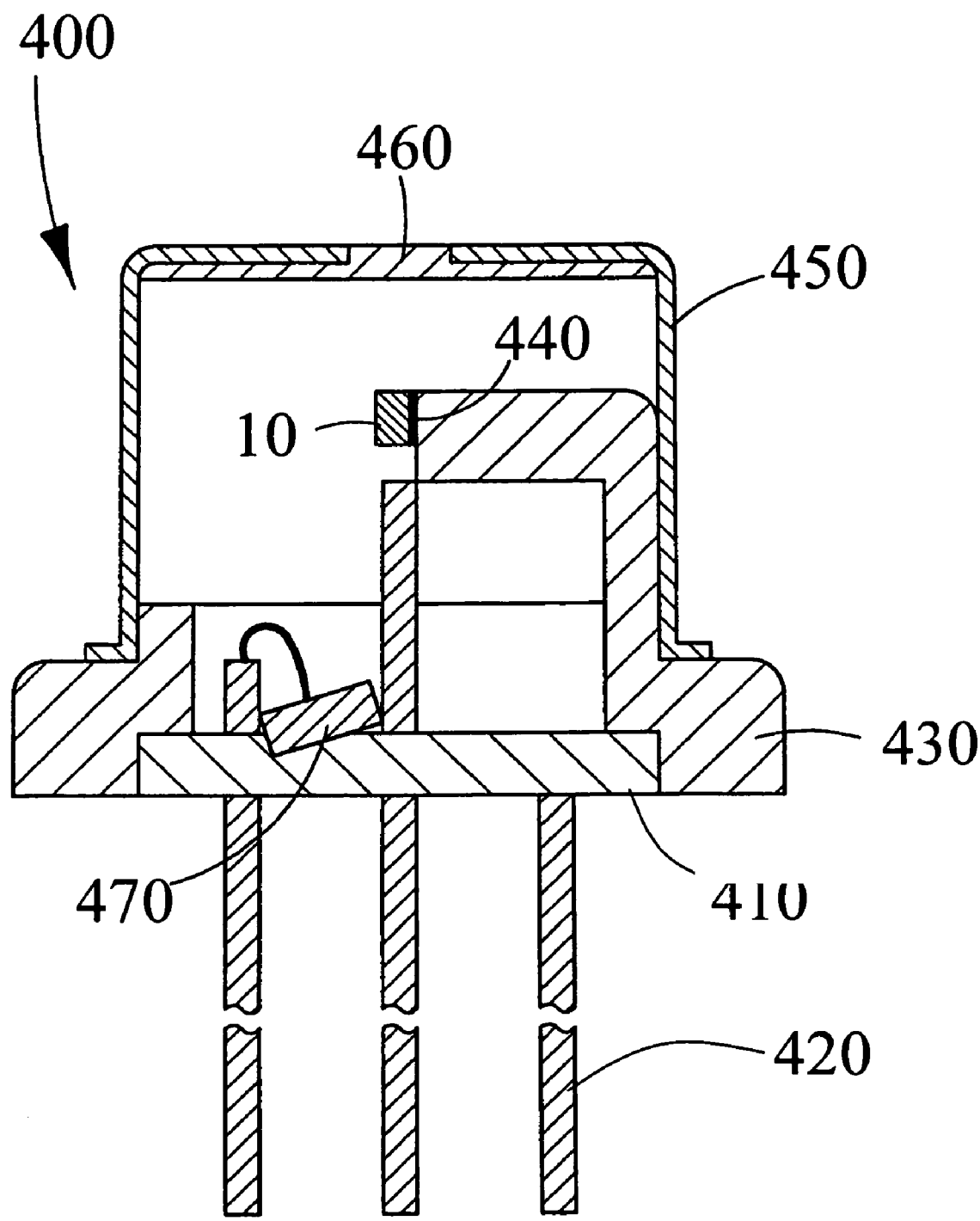
FIG. 29 is a schematic cross-sectional view showing a third specific example of the semiconductor light emitting apparatus of an embodiment of the invention.

FIG. 29 is a schematic cross-sectional view showing a third specific example of the semiconductor light emitting apparatus of an embodiment of the invention. More specifically, this figure shows a so-called can-seal type semiconductor light emitting apparatus.

The semiconductor light emitting apparatus 400 comprises a stem 410, a stem mount 430, and a sealing can 450. The stem 410 is provided with lead pins 420, enabling external electrical connection. The stem mount 430 is secured to the stem 410. A semiconductor light emitting device 10 is mounted at the tip of the stem mount 430 in the junction down configuration via a submount 440. Above the stem 410, a monitoring light-receiving device 470 is provided for monitoring output from the semiconductor light emitting device 10 and performing appropriate feedback control.

The semiconductor light emitting device 10 is sealed with the sealing can 450. Laser light emitted from the semiconductor light emitting device 10 is picked up externally via a window 460 made of translucent material such as glass, provided in the sealing can 450.

Also in this embodiment, as described above with reference to FIGS. 1 to 26, slits 16 are provided as appropriate on the mounting surface of the semiconductor light emitting device 10 to suppress formation of void in the solder layer below the ridge stripe. It is thus possible to achieve a can-seal type semiconductor light emitting apparatus that has increased physical bonding strength for the submount 440 and can maintain good thermal contact at the same time.

The embodiments of the invention have been described with reference to specific examples. However, the invention is not limited to these specific examples. For example, any details of the layered structure constituting the semiconductor light emitting device modified as appropriate by those skilled in the art are also encompassed within the scope of the invention, as long as they comprise the feature of the invention. For example, the active layer may be made of various materials in addition to InGaAlP-based material, including $Ga_xIn_{1-x}As_yN_{1-y}$-based ($0 \leq x \leq 1$, $0 \leq y < 1$), AlGaAs-based, and InGaAsP-based materials. Similarly, the cladding layers and optical guide layer may also be made of various materials.

Any shape and size of the semiconductor light emitting device modified as appropriate by those skilled in the art are also encompassed within the scope of the invention, as long as they comprise the feature of the invention. Moreover, the shape and size of the ridge stripe, the shape and arrangement relationship of the dummy ridges, and the shape and number of the slits may also be modified in various ways, any of which is encompassed within the scope of the invention.

On the other hand, also with respect to the semiconductor light emitting apparatus of the invention, various apparatuses other than those described above as the specific examples are encompassed within the scope of the invention. They include, for example, a semiconductor light emitting apparatus having a receptacle for coupling an optical fiber in which the semiconductor light emitting device of the invention is incorporated, and a semiconductor light emitting apparatus having a packaging substrate on which the semiconductor light emitting device of the invention is mounted. In effect, any semiconductor light emitting apparatus in which a semiconductor light emitting device of the invention is mounted in the junction down configuration belongs to the scope of the semiconductor light emitting apparatus of the invention.

Any other semiconductor light emitting devices and semiconductor light emitting apparatuses that can be modified and implemented as appropriate by those skilled in the art on the basis of the semiconductor light emitting devices and semiconductor light emitting apparatuses described above as the embodiments of the invention also belong to the scope of the invention.

While the present invention has been disclosed in terms of the embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A semiconductor light emitting device comprising:
   a stacked body of semiconductor including an active layer;
   a ridge stripe protruding and extending in a first direction continuously on a first major surface of the stacked body, the ridge stripe including at least a portion of a waveguide that guides light emission generated by injected current;
   dummy ridges protruding on the first major surface of the stacked body on both sides of the ridge stripe;
   a first slit formed on the first major surface of the stacked body, the first slit extending along a second direction which crosses the first direction, and the first slit dividing one of the dummy ridges; and
   a second slit formed on the first major surface of the stacked body, the second slit extending along a third direction which crosses the first direction, and the second slit dividing another of the dummy ridges.

2. The semiconductor light emitting device as claimed in claim 1, further comprising a solder layer provided on the ridge stripe and the dummy ridges.

3. The semiconductor light emitting device as claimed in claim 1, wherein a height of the ridge stripe on the first major surface is smaller than a height of the dummy ridges.

4. The semiconductor light emitting device as claimed in claim 3, wherein an insulating layer is provided on side surfaces of the ridge stripe and on side surfaces and top surfaces of the dummy ridges.

5. The semiconductor light emitting device as claimed in claim 3, wherein an insulating layer is provided on top surfaces of the dummy ridges.

6. The semiconductor light emitting device as claimed in claim 3, wherein a current blocking layer is provided in basal portions of the dummy ridges.

7. The semiconductor light emitting device as claimed in claim 1, wherein a plurality of the slits are provided on both sides of the ridge stripe, respectively.

8. The semiconductor light emitting device as claimed in claim 7, wherein the dummy ridges are divided into a plurality of triangular patterns by the slits.

9. The semiconductor light emitting device as claimed in claim 7, wherein the dummy ridges are divided into a plurality of trapezoidal patterns by the slits.

10. The semiconductor light emitting device as claimed in claim 7, wherein the dummy ridges are divided into a plurality of elliptic patterns by the slits.

11. The semiconductor light emitting device as claimed in claim 1, wherein a taper portion is provided at least partially on side surfaces of the dummy ridges.

12. The semiconductor light emitting device as claimed in claim 1, wherein a taper portion is provided entirely on side surfaces of the dummy ridges.

13. A semiconductor light emitting apparatus comprising:
   a packaging member; and
   a semiconductor light emitting device having:
      a stacked body of semiconductor including an active layer;
      a ridge stripe protruding and extending in a first direction continuously on a first major surface of the stacked body, the ridge stripe including at least a portion of a waveguide that guides light emission generated by injected current;
      dummy ridges protruding on the first major surface of the stacked body on both sides of the ridge stripe;
      a first slit formed on the first major surface of the stacked body, the first slit extending along a second direction which crosses the first direction, and the first slit dividing one of the dummy ridges; and a second slit formed on the first major surface of the stacked body, the second slit extending along a third direction which crosses the first direction, and the second slit dividing another of the dummy ridges, the semiconductor light emitting device being bonded to the packaging member so that the packaging member faces the first major surface.

14. The semiconductor light emitting apparatus as claimed in claim 13, wherein the semiconductor light emitting device is bonded to the packaging member by a solder.

15. The semiconductor light emitting apparatus as claimed in claim 13, wherein a height of the ridge stripe on the first major surface is smaller than a height of the dummy ridges.

16. The semiconductor light emitting apparatus as claimed in claim 15, wherein an insulating layer is provided on top surfaces of the dummy ridges.

17. The semiconductor light emitting apparatus as claimed in claim 13, wherein a plurality of the slits are provided on both sides of the ridge stripe, respectively.

18. The semiconductor light emitting apparatus as claimed in claim 13, wherein a width of the slit changes along the second direction.

19. The semiconductor light emitting apparatus as claimed in claim 13, wherein a taper portion is provided at least partially on side surfaces of the dummy ridges.

20. The semiconductor light emitting apparatus as claimed in claim 13, wherein a taper portion is provided entirely on side surfaces of the dummy ridges.

* * * * *